US012593631B2

(12) United States Patent
Chen

(10) Patent No.: US 12,593,631 B2
(45) Date of Patent: Mar. 31, 2026

(54) SEMICONDUCTOR DEVICE AND MANUFACTURING METHOD THEREOF

(71) Applicant: Hon Young Semiconductor Corporation, Hsinchu City (TW)

(72) Inventor: Yan-Ru Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 456 days.

(21) Appl. No.: 18/170,525

(22) Filed: Feb. 16, 2023

(65) Prior Publication Data

US 2024/0170289 A1     May 23, 2024

(30) Foreign Application Priority Data

Nov. 22, 2022    (TW) .................................. 111144664

(51) Int. Cl.
| | |
|---|---|
| *H01L 21/04* | (2006.01) |
| *H10D 30/66* | (2025.01) |
| *H10D 62/17* | (2025.01) |
| *H10D 62/832* | (2025.01) |

(52) U.S. Cl.
CPC ......... *H01L 21/0465* (2013.01); *H10D 30/66* (2025.01); *H10D 62/393* (2025.01); *H10D 62/8325* (2025.01)

(58) Field of Classification Search
CPC .. H01L 21/0465; H10D 30/66; H10D 62/393; H10D 62/8325

USPC .......................................................... 257/77
See application file for complete search history.

(56) References Cited

U.S. PATENT DOCUMENTS

2013/0137254 A1     5/2013   Shiomi

FOREIGN PATENT DOCUMENTS

| | | | | |
|---|---|---|---|---|
| CN | 101572249 A | 11/2009 | | |
| CN | 105070688 A | 11/2015 | | |
| CN | 111192916 A | * 5/2020 | .......... | H10D 62/105 |
| CN | 112701151 A | 4/2021 | | |
| CN | 114551224 A | * 5/2022 | .............. | B08B 3/08 |
| CN | 114695093 A | 7/2022 | | |
| WO | 2017041268 A1 | 3/2017 | | |

* cited by examiner

*Primary Examiner* — Fazli Erdem
(74) *Attorney, Agent, or Firm* — CKC & Partners Co., LLC

(57)     ABSTRACT

Some embodiments of the present disclosure provide a method of forming a semiconductor device including forming a dielectric layer stack on an epitaxial layer. The dielectric layer stack includes at least one first layer and at least one second layer, the at least one first layer is made of a first material, the at least second layer is made of a second material different from the first material. The dielectric layer stack is patterned to form a staircase-shaped dielectric layer stack. An ion implantation process is performed to the epitaxial layer by using the staircase-shaped dielectric layer stack.

14 Claims, 24 Drawing Sheets

100

100

SEMICONDUCTOR DEVICE AND MANUFACTURING METHOD THEREOF

CROSS-REFERENCE TO RELATED APPLICATION

This application claims priority to Taiwan Application Serial Number 111144664, filed Nov. 22, 2022, which is herein incorporated by reference in its entirety.

BACKGROUND

Field of Invention

The present disclosure relates to a semiconductor device and a manufacturing method thereof.

Description of Related Art

Silicon carbide power transistors have characteristics of high blocking voltage, low on resistance, high thermal conductivity, so that silicon carbide power transistors are getting more and more attention. The resistance of the silicon carbide power transistor may consist of the resistance of different components, such as the contact, the channel, the gate, the drift region, and the substrate, in the transistor. The resistance of the drift region accounts for a large part of the resistance of the silicon carbide power transistor.

SUMMARY

Some embodiments of the present disclosure provide a method of forming a semiconductor device including forming a dielectric layer stack on an epitaxial layer. The dielectric layer stack includes at least one first layer and at least one second layer, the at least one first layer is made of a first material, the at least second layer is made of a second material different from the first material. The dielectric layer stack is patterned to form a staircase-shaped dielectric layer stack. An ion implantation process is performed to the epitaxial layer by using the staircase-shaped dielectric layer stack.

In some embodiments, patterning the dielectric layer stack includes performing a first patterning process to pattern the dielectric layer stack by using a photomask, and the dielectric layer stack has a first sidewall. The photomask is moved along a first direction and a second patterning process is performed to partially pattern the dielectric layer stack, so that the dielectric layer stack has the first sidewall and a second sidewall shifted along the first direction, the second sidewall is above the first sidewall.

In some embodiments, patterning the dielectric layer stack further includes moving the photomask along the first direction and performing a third patterning process to partially pattern the dielectric layer stack, so that the dielectric layer stack has a third sidewall. The third sidewall is shifted along the first direction compared to the second sidewall, and the third sidewall is above the second sidewall.

In some embodiments, patterning the dielectric layer stack further includes moving the photomask along a second direction opposite to the first direction, and performing a fourth patterning process to partially pattern the dielectric layer stack, so that the dielectric layer stack further has a fourth sidewall and a fifth sidewall shifted along the second direction, the fifth sidewall is above the fourth sidewall.

In some embodiments, patterning the dielectric layer stack includes using a first etching gas to etch the at least one second layer of the dielectric layer stack, and using a second etching gas to etch the at least one first layer of the dielectric layer stack, wherein the first etching gas is different from the second etching gas.

In some embodiments, a well region is formed when performing the ion implantation process to the epitaxial layer, and the staircase-shaped dielectric layer stack partially covers the well region.

In some embodiments, the well region has a width, and the width becomes greater as being closer to the staircase-shaped dielectric layer stack.

Some embodiments of the present disclosure provide a semiconductor device, including a substrate, an epitaxial layer, a first well region, a source region, a base region and a gate layer. The epitaxial layer is on the substrate. The first well region is in the epitaxial layer, and the first well region has a boundary, and an angle between the boundary and an upper surface of the epitaxial layer is between 45 degrees to 80 degrees. The source region is in the first well region. The base region is in the first well region and adjacent to the source region. The gate layer is over the epitaxial layer and covers a portion of the first well region.

In some embodiments, the semiconductor device further includes a second well region in the epitaxial layer, and the second well region has a boundary and the boundary of the second well region and the boundary of the first well region are getting closer as being closer to the gate layer.

In some embodiments, the epitaxial layer includes a drift region under the first well region, the drift region has a plurality dopants of a first semiconductor type, the first well region has a plurality dopants of a second semiconductor type, the first semiconductor type and the semiconductor type are different semiconductor types.

In some embodiments, the boundary of the first well region is slanting.

Some embodiments of the present disclosure provide a method of forming a semiconductor device including forming a dielectric layer stack on an epitaxial layer, and the dielectric layer stack includes first layers and second layers, the first layers are made of a first material, the second layers are made of a second material different from the first material. The dielectric layer stack is patterned to form a staircase-shaped dielectric layer stack. An ion implantation process is performed to the epitaxial layer by using the staircase-shaped dielectric layer stack to form a first well region in the epitaxial layer, and a boundary of the first well region is staircase-shaped.

In some embodiments, patterning the dielectric layer stack includes performing a first patterning process to pattern the dielectric layer stack by using a photomask, and the dielectric layer stack has a first sidewall. The photomask is moved along a first direction and performing a second patterning process to partially pattern the dielectric layer stack, so that the dielectric layer stack has the first sidewall and a second sidewall shifted along the first direction, the second sidewall is above the first sidewall.

In some embodiments, patterning the dielectric layer stack further includes moving the photomask along the first direction and performing a third patterning process to partially pattern the dielectric layer stack, so that the dielectric layer stack has a third sidewall, wherein the third sidewall is shifted along the first direction compared to the second sidewall, and the third sidewall is above the second sidewall.

In some embodiments, patterning the dielectric layer stack further includes moving the photomask along the first direction and performing a fourth patterning process to partially pattern the dielectric layer stack, so that the dielectric layer stack has a fourth sidewall, wherein the third sidewall is shifted along the first direction compared to the third sidewall, and the fourth sidewall is above the third sidewall.

In some embodiments, patterning the dielectric layer stack further includes moving the photomask along a second direction opposite to the first direction, and performing a fifth patterning process to partially pattern the dielectric layer stack, so that the dielectric layer stack further has a fifth sidewall and a sixth sidewall shifted along the second direction, the sixth sidewall is above the fifth sidewall.

In some embodiments, patterning the dielectric layer stack further includes moving the photomask along the second direction, and performing a sixth patterning process to partially pattern the dielectric layer stack, so that the dielectric layer stack further has a seventh sidewall shifted along the second direction compared to the sixth sidewall, the seventh sidewall is above the sixth sidewall.

In some embodiments, patterning the dielectric layer stack further includes moving the photomask along the second direction, and performing a seventh patterning process to partially pattern the dielectric layer stack, so that the dielectric layer stack further has an eighth sidewall shifted along the second direction compared to the seventh sidewall, the eighth sidewall is above the seventh sidewall.

In some embodiments, the staircase-shaped dielectric layer stack partially covers the first well region after performing the ion implantation process.

In some embodiments, the method further includes removing the staircase-shaped dielectric layer stack after performing the ion implantation process.

As mentioned above, the profiles of the well regions in some embodiments of the present disclosure are beneficial to reduce the possibility of contact between the depletion regions when the semiconductor device is turned on, thereby reducing the resistance of the semiconductor device. Moreover, the staircase-shaped dielectric layer stack including first layers and second layers are used as the mask in some embodiments of the present disclosure. Therefore, the profiles of the boundaries of the well regions are adjusted to reduce the resistance of the semiconductor device.

It is to be understood that both the foregoing general description and the following detailed description are by examples, and are intended to provide further explanation of the description as claimed.

DETAILED DESCRIPTION

Some embodiments of the present disclosure are related to methods of reducing the resistance of the semiconductor device, such as transistors. The profile of well regions of the semiconductor device may be modified to change the profile of PN junction of the semiconductor device, thereby reducing the possibility of contact between the depletion regions when turning on the semiconductor device.

Figure 1:
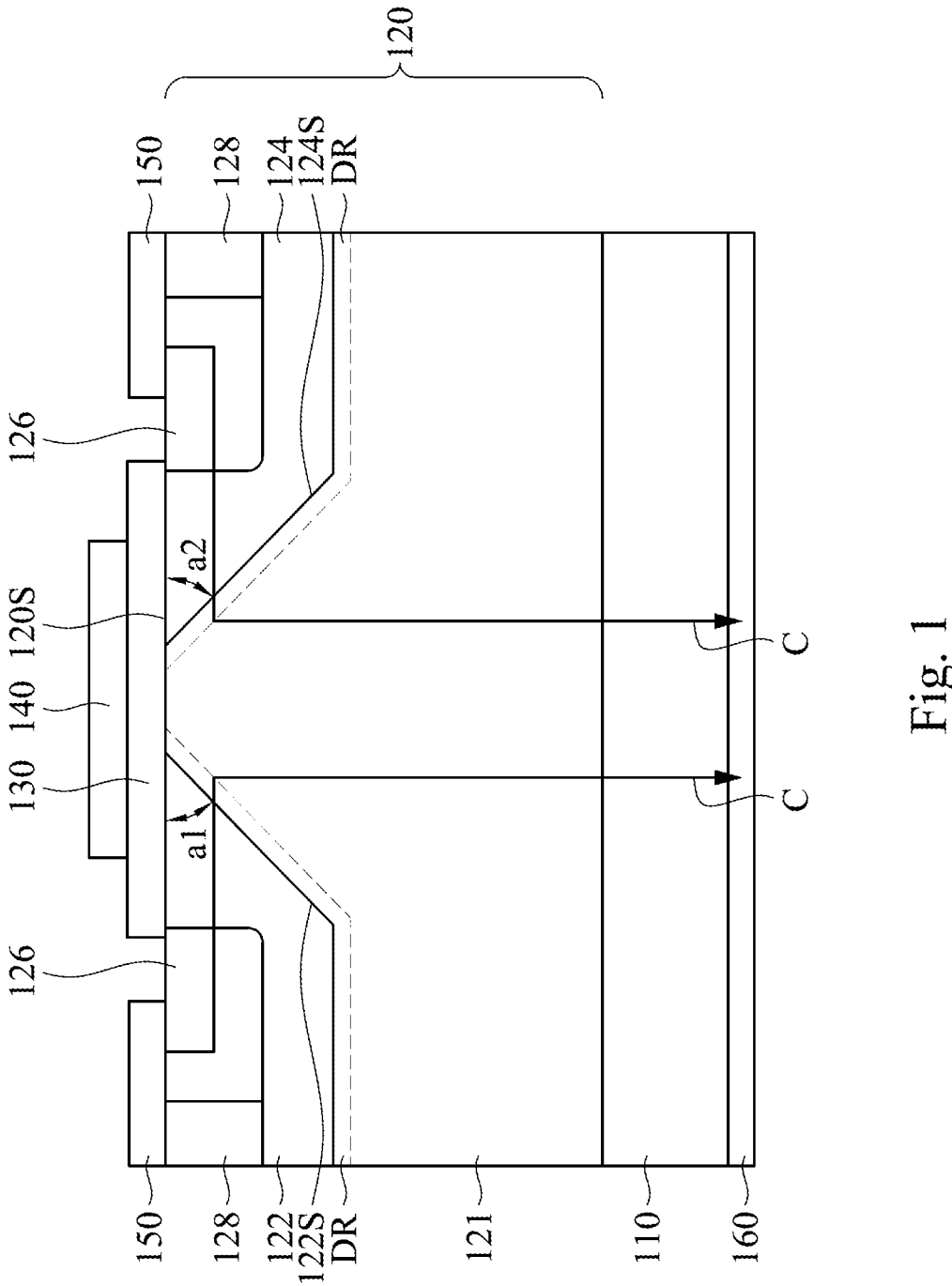
FIG. 1 illustrates a cross-section view of the semiconductor device in some embodiments of the present disclosure.

FIG. 1 illustrates a cross-section view of the semiconductor device 100 in some embodiments of the present disclosure. The semiconductor device 100 includes a substrate 110, an epitaxial layer 120, a drift region 121, a first well region 122, a second well region 124, a source region 126, a base region 128 and a gate layer 140.

The epitaxial layer 120 is on the substrate 110. The first well region 122 is in the epitaxial layer 120. The first well region 122 has a boundary 122S, and the angle a1 between the boundary 122S and the upper surface 120S of the epitaxial layer 120 is between 45 degrees to 80 degrees. The second well region 124 is in the epitaxial layer 120. The source region 126 is in the first well region 122. The base region 128 is in the first well region 122 and adjacent to the source region 126. The gate layer 140 is on the epitaxial layer 120 and covers a portion of the first well region 122. The second well region 124 is in the epitaxial layer 120 and adjacent to the first well region 122. The source region 126 and the base region 128 may also be in the second well region 124, and the base region 128 is adjacent to the source region 126. The gate layer 140 also covers a portion of the second well region 124.

The substrate 110, the drift region 121 and the source region 126 include a plurality of dopants of a first semiconductor type. The first well region 122, the second well region 124 and the base region 128 include a plurality of dopants of a second semiconductor type, and the second semiconductor type is different from the first semiconductor type. In some embodiments, when the first semiconductor type is N type, and the dopants of the first semiconductor type may be phosphorous, arsenic, nitrogen, etc., the second semiconductor type may be P type, and the dopants of the second semiconductor type may be boron, gallium, and aluminum, etc. In some embodiments, when the first semiconductor type is P type, and the dopants of the first semiconductor type may be boron, gallium, and aluminum, etc., the second semiconductor type may be N type, and the dopants of the second semiconductor type may be phosphorous, arsenic, nitrogen, etc. In some embodiments, the substrate 110 and the source region 126 are heavily doped regions having dopants of the first semiconductor type, the drift region 121 is a lightly doped region having dopants of the first semiconductor type, the first well region 122 and the second well region 124 are lightly doped regions having dopants of the second semiconductor type, the base region 128 is a heavily doped region having dopants of the second semiconductor type. That is, the doping concentration of the substrate 110 and the source region 126 is higher than the doping concentration of the drift region 121, and the doping concentration of the base region 128 is higher than the doping concentration of the first well region 122 and the second well region 124.

The semiconductor device 100 further includes a gate dielectric layer 130, a source contact 150 and a drain electrode 160. The gate dielectric layer 130 is on the epitaxial layer 120 and between the epitaxial layer 120 and the gate layer 140. The source contact 150 is in contact with the source region 126. The drain electrode 160 is under the substrate 110. Therefore, the drain electrode 160 and the epitaxial layer 120 are at the opposite sides of the substrate 110. Since the first well region 122 (or the second well region 124) and the drift region 121 include the dopants of different semiconductor type respectively, a PN junction (i.e. at the boundaries 122S and 124S) is formed between the first well region 122 (or the second well region 124) and the drift region 121. When the semiconductor device 100 is turned on, depletion regions DR formed near the PN junctions. When the applied voltage becomes greater, the depletion regions DR expands outward from the PN junctions. In order to prevent from the contact between the depletion regions DR, which causes the electron flow cannot flow from the source contact 150 to the drain electrode 160 along the arrow C, thereby resulting in pinch off effect, the profiles of the first well region 122 and the second well region 124 maybe designed to reduce the possibility of the contact between the depletion regions DR, thereby reducing the resistance of the semiconductor device 100.

The first well region 122 has the boundary 122S, and the second well region 124 has a boundary 124S. The boundary 124S of the second well region 124 and the boundary 122S of the first well region 122 are getting closer as being closer to the gate layer 140. Specifically, the boundary 122S of the first well region 122 and the boundary 124S of the second well region 124 are substantially slanting or staircase-shaped boundaries, and the width of the first well region 122 and the width of the second well region 124 both become bigger as being closer to the gate layer 140. In some embodiments, the angle a1 between the boundary 122S of the first well region 122 and the upper surface 120S of the epitaxial layer 120 is between 45 degrees to 80 degrees, and the angle a2 between the boundary 124S of the second well region 124 and the upper surface 120S of the epitaxial layer 120 is between 45 degrees to 80 degrees. When the first well region 122 and the second well region 124 have the profiles as shown in FIG. 1 and the semiconductor device 100 is turned on, it is difficult for the depletion regions DR near the PN junctions to be in contact with each other, or only the upmost portion of the depletion regions DR are in contact with each other. Therefore, there is still a large space between the first well region 122 and the second well region 124 for the electron flow to pass through. As such, the resistance of the semiconductor device 100 is significantly reduced.

Figure 2:
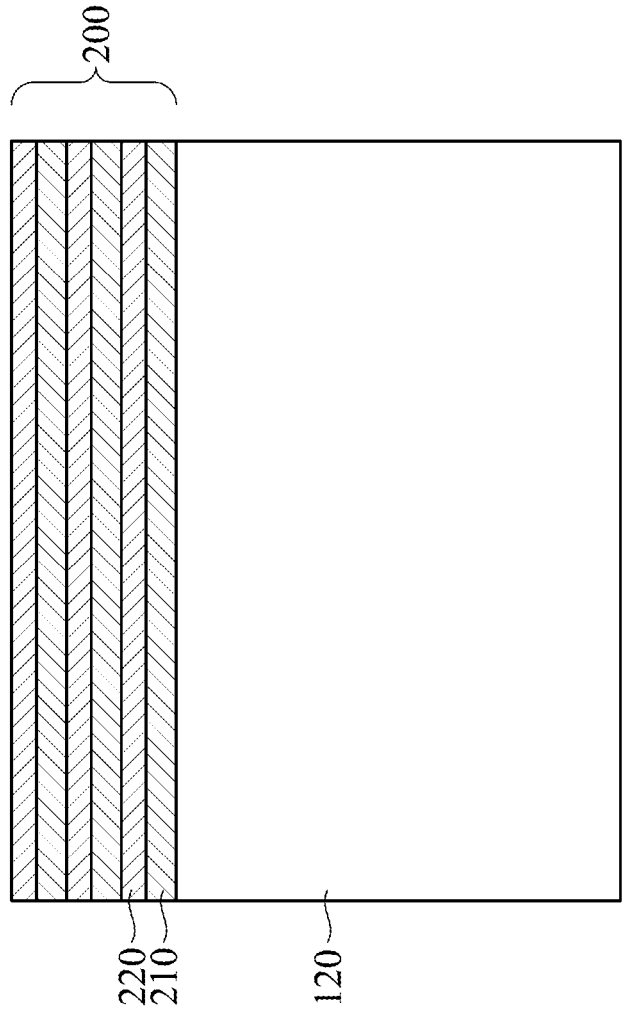
FIGS. 2-24 illustrate cross-section views of the manufacturing method of the semiconductor device in some embodiments of the present disclosure.
Figure 3:
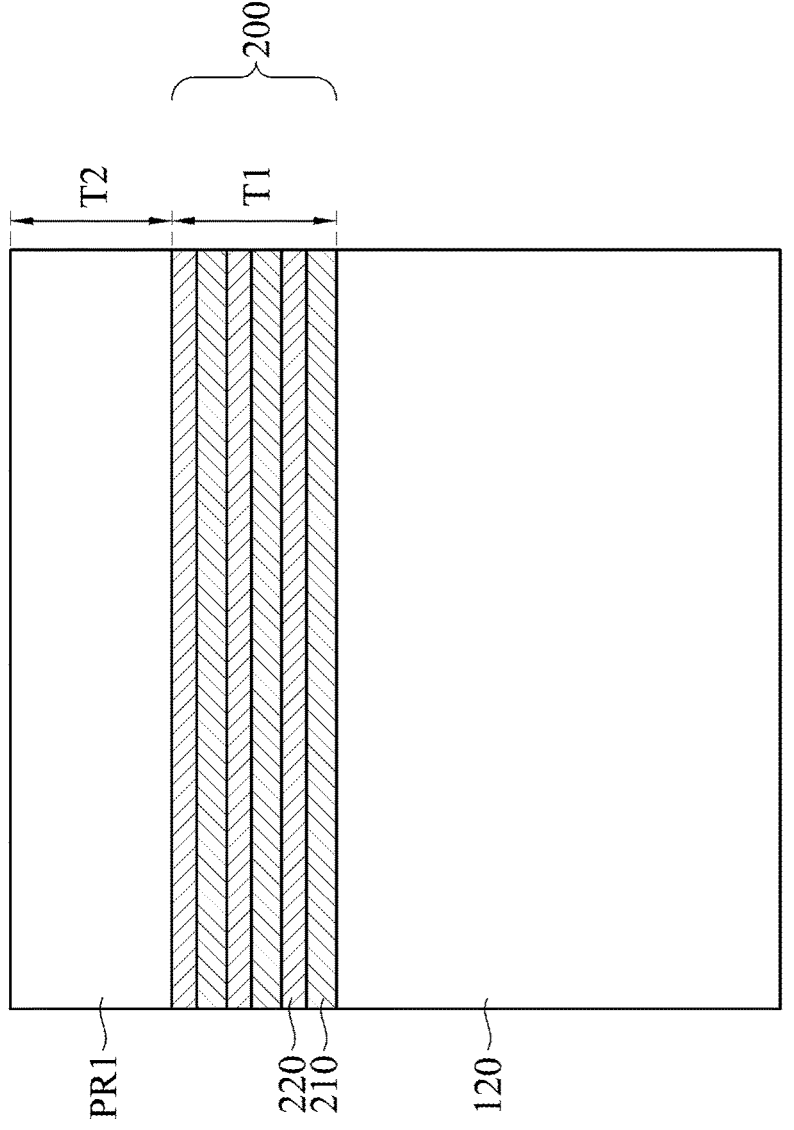

FIGS. 2-24 illustrate cross-section views of the manufacturing method of the semiconductor device 100 in some embodiments of the present disclosure. Referring to FIG. 2, a dielectric layer stack 200 is formed on the epitaxial layer 120. The dielectric layer stack 200 includes at least one first layer 210 and at least one second layer 220. The first layers 210 are made of the first material, and the second layers 220 are made of the second material different from the first material. In some embodiments, the first layers 210 are made of silicon oxide, and the second layers 220 are made of silicon nitride. When the dielectric layer stack 200 includes a first layer 210 and a second layer 220, the second layer 220 is on the first layer 210. When the dielectric layer stack 200 includes multiple first layers 210 and multiple second layers 220, the first layers 210 and the second layers 220 are alternately stacked. Therefore, a second layer 220 may be sandwiched by two first layers 210, and a first layer 210 may be sandwiched by two second layers 220, as shown in FIG. 2. The number and the thickness of the layers of the dielectric layer stack 200 may be determined based on the profiles of the first well region 122 and the second well region 124 to be formed. In some embodiments, the number of the layers of dielectric layer stack 200 may between 2 to 10. In some embodiments, the thickness of each of the layers of the dielectric layer stack 200 is between 0.05 micrometers to 5 micrometers. In some embodiments, the more layers of the dielectric layer stack 200 has, the more approximate boundaries of the first well region 122 (see FIG. 1) and the second well region 124 (see FIG. 1) to slant lines may be formed in subsequent processes. In some embodiments, the greater thickness each of the layers of the dielectric layer stack 200 has, the steeper boundaries of the first well region 122 and the second well region 124 are formed. Due to convenience of describing the method of forming the first well region 122 and the second well region 124 in some embodiments of the present disclosure in later descriptions, FIG. 2 illustrates that the dielectric layer stack 200 has three first layers 210 and three second layers 220 alternately stacked. However, the number of the layers of the dielectric layer stack 200 is not limited thereto.

In some embodiments, before forming the dielectric layer stack 200, the epitaxial layer 120 is first formed on the substrate 110 (see FIG. 1). The substrate 110 may be any suitable substrates. In some embodiments, the substrate 110 may be made of (but not limited to) silicon carbide. The substrate 110 may be doped with dopants of the first semiconductor type. For example, the substrate 110 may be heavily doped substrate. The epitaxial layer 120 may be made of (but not limited to) silicon carbide. The epitaxial layer 120 may be doped with dopants of the first semiconductor type. For example, the epitaxial layer 120 may be lightly doped region. That is, the doping concentration of the epitaxial layer 120 may be lower than the doping concentration of the substrate 110.

Referring to FIGS. 3-22, the dielectric layer stack 200 is patterned to form a staircase-shaped dielectric layer stack 200'. Specifically, referring to FIG. 3, a photoresist layer PR1 is formed on the dielectric layer stack 200 and the epitaxial layer 120. In some embodiments, the thickness T2 of the photoresist layer PR1 is greater than 3 micrometers, or the thickness T2 of the photoresist layer PR1 is more than 1 micrometer thicker than the thickness T1 of the dielectric layer stack 200. As such, it ensures that the photoresist layer PR1 may protect specific regions of the dielectric layer stack 200 from being etched in subsequent processes (such as the dielectric layer stack 200 under the portion P11 of the photoresist layer PR1).

Figure 4:
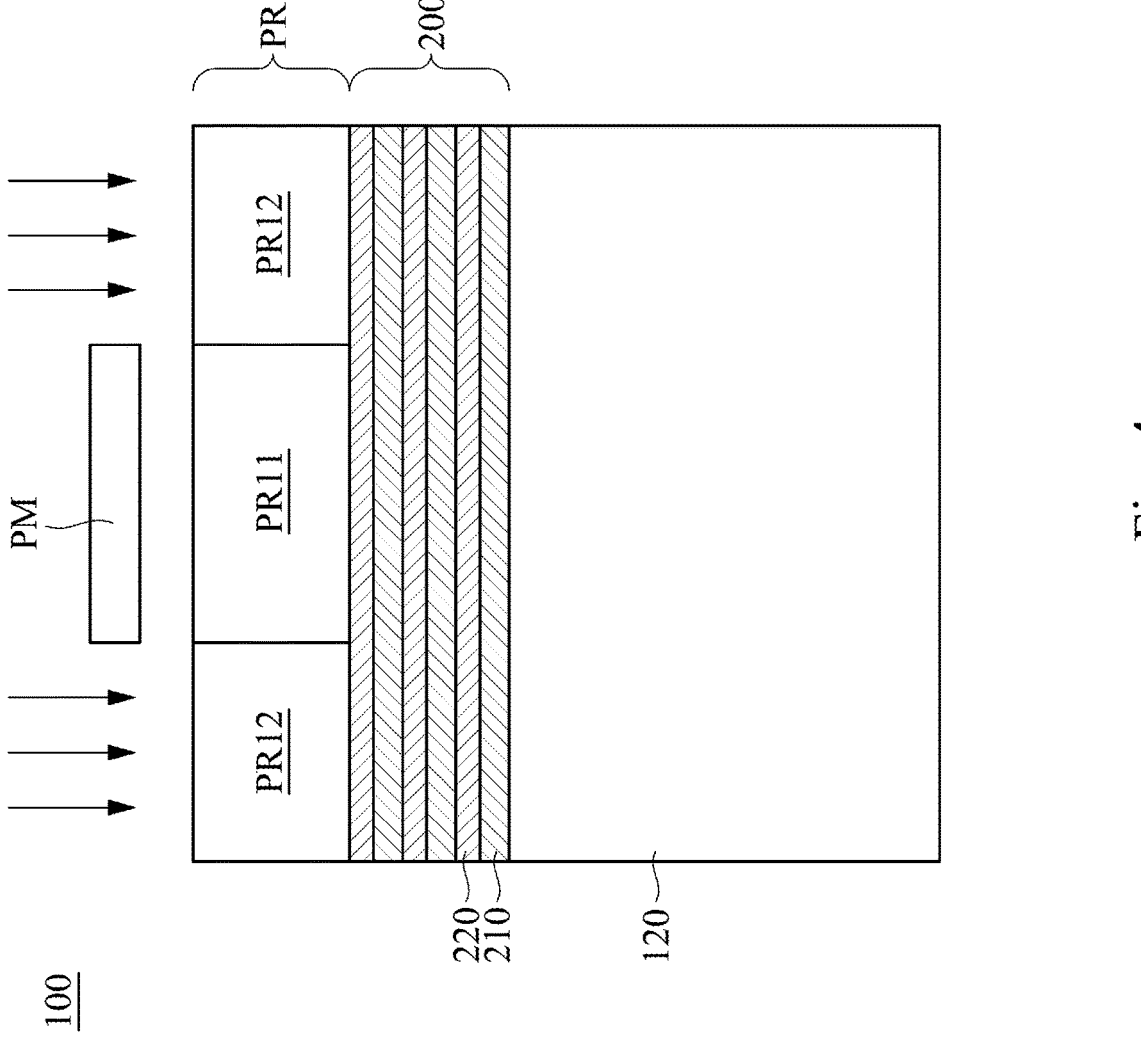
Figure 5:
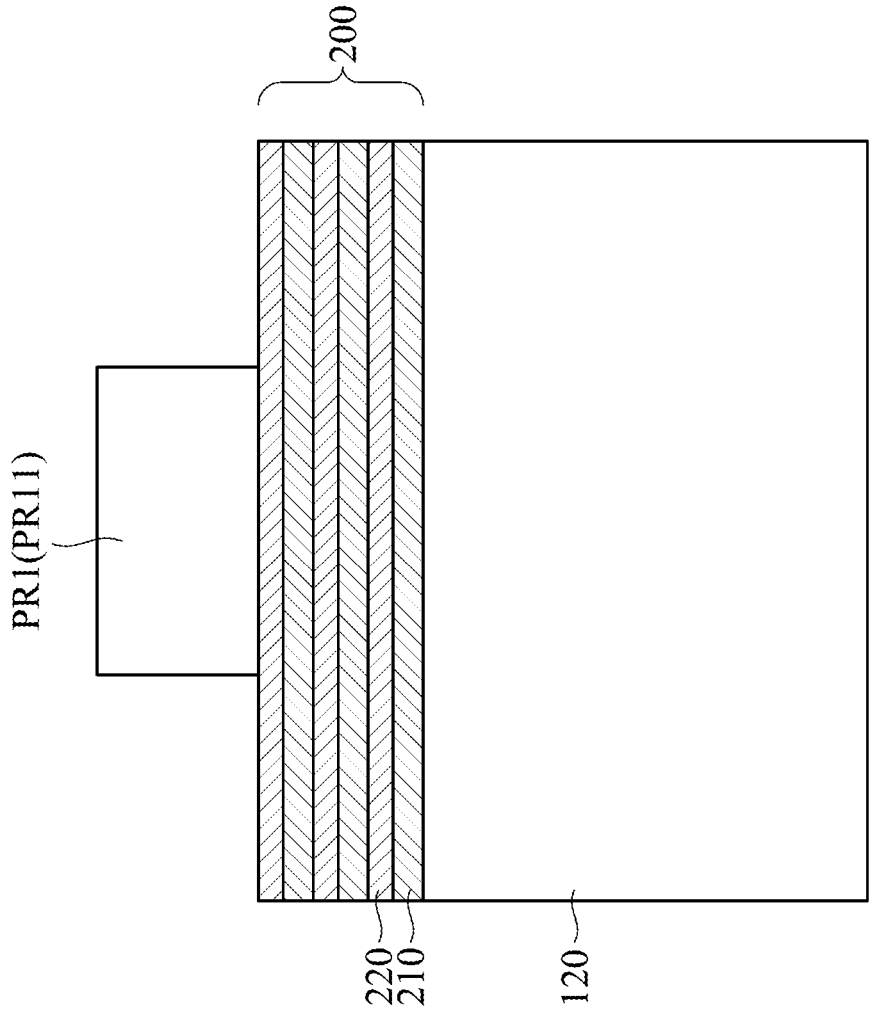
Figure 6:
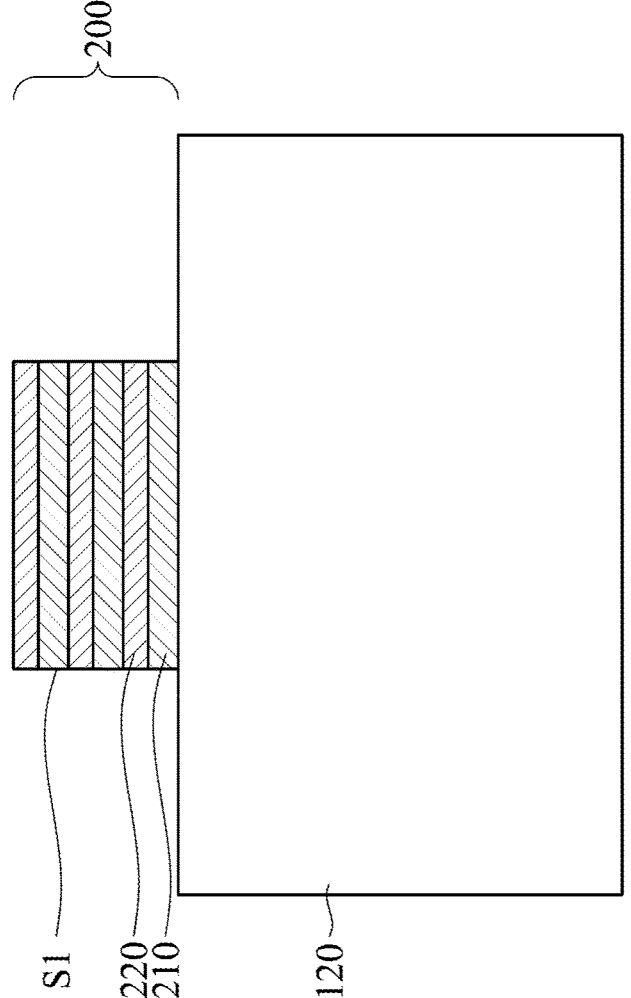

Subsequently, Referring to FIGS. 4-6, a first patterning process is performed to pattern the dielectric layer stack 200 by using a photomask PM, and the dielectric layer stack 200 has a first sidewall S1. Specifically, referring to FIG. 4, the photoresist layer PR1 is exposed by using the photomask PM, and the photoresist layer PR1 may be divided into an unexposed portion PR11 and an exposed portion PR12. Subsequently, referring to FIG. 5, the photoresist layer PR1 is developed to remove the exposed portion PR12 of the photoresist layer PR1, and the unexposed portion PR11 of the photoresist layer PR1 remains. Subsequently, referring to FIG. 6, the dielectric layer stack 200 is patterned by using the portion PR11 of the photoresist layer PR1. The dielectric layer stack 200 has the first sidewall S1. The first layers 210 and the second layers 220 of the dielectric layer stack 200 are made of different materials. Therefore, during patterning the dielectric layer stack 200, a first etching gas is used to etch the second layer 220 of the dielectric layer stack 200, and then a second etching gas is used to etch the first layer 210 of the dielectric layer stack 200. The first etching gas is different from the second etching gas. The first etching gas has a high etching selectivity between the first layers 210 and the second layers 220. Specifically, the first etching gas may be used to etch the second layers 220 but is not able to be used to etch the first layers 210. The second etching gas has a high etching selectivity between the first layers 210 and the second layers 220. For example, the second etching gas may be used to etch the first layers 210 but is not able to be used to etch the second layers 220. Therefore, when the portion PR11 of the photoresist layer PR1 is used as the mask to pattern the dielectric layer stack 200, the first etching gas is first used to etch the upmost layer of the second layer 220. The patterned upmost layer of the second layer 220 may serve as the mask, and then the second etching gas is used to pattern the upmost layer of the first layer 210. Subsequently, the first etching gas and the second etching gas are repeatedly used to pattern the dielectric layer stack 200, until all the layers of the dielectric layer stack 200 are patterned to form the first sidewall S1 of the dielectric layer stack 200. The first sidewall S1 is aligned with the portion PR11 (FIG. 5) of the photoresist layer PR1. Subsequently, the portion PR11 of the photoresist layer PR1 is removed.

Figure 7:
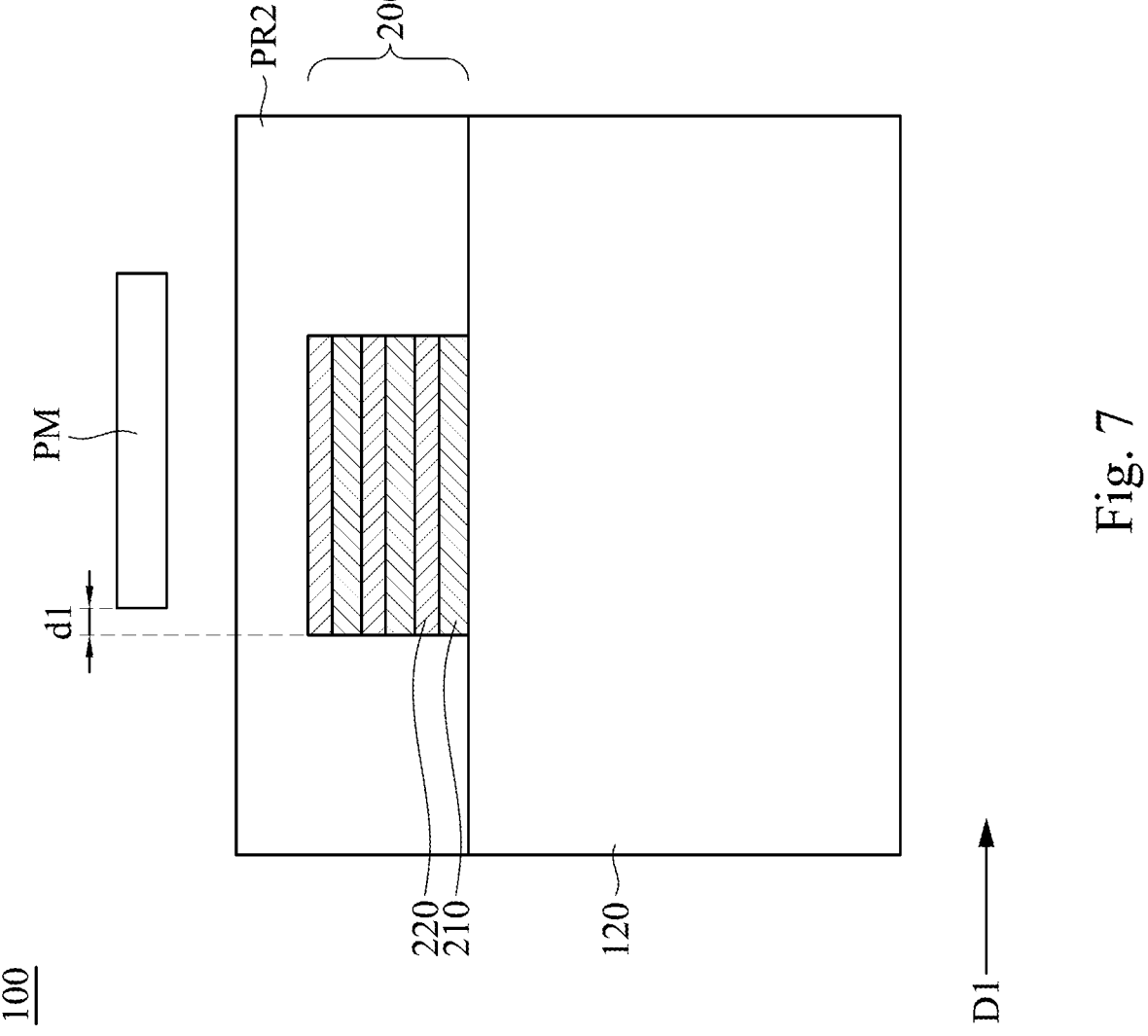
Figure 8:
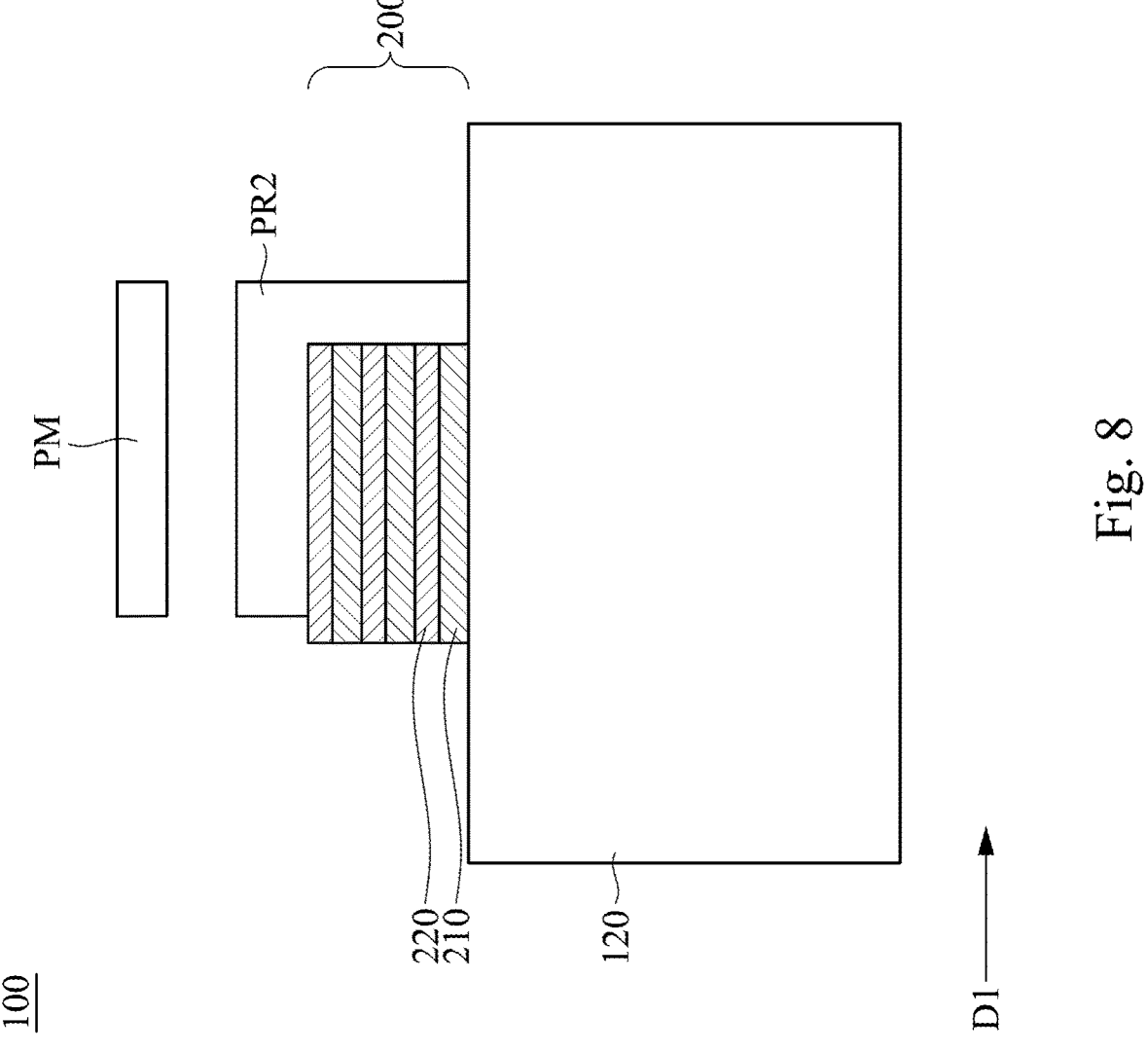
Figure 9:
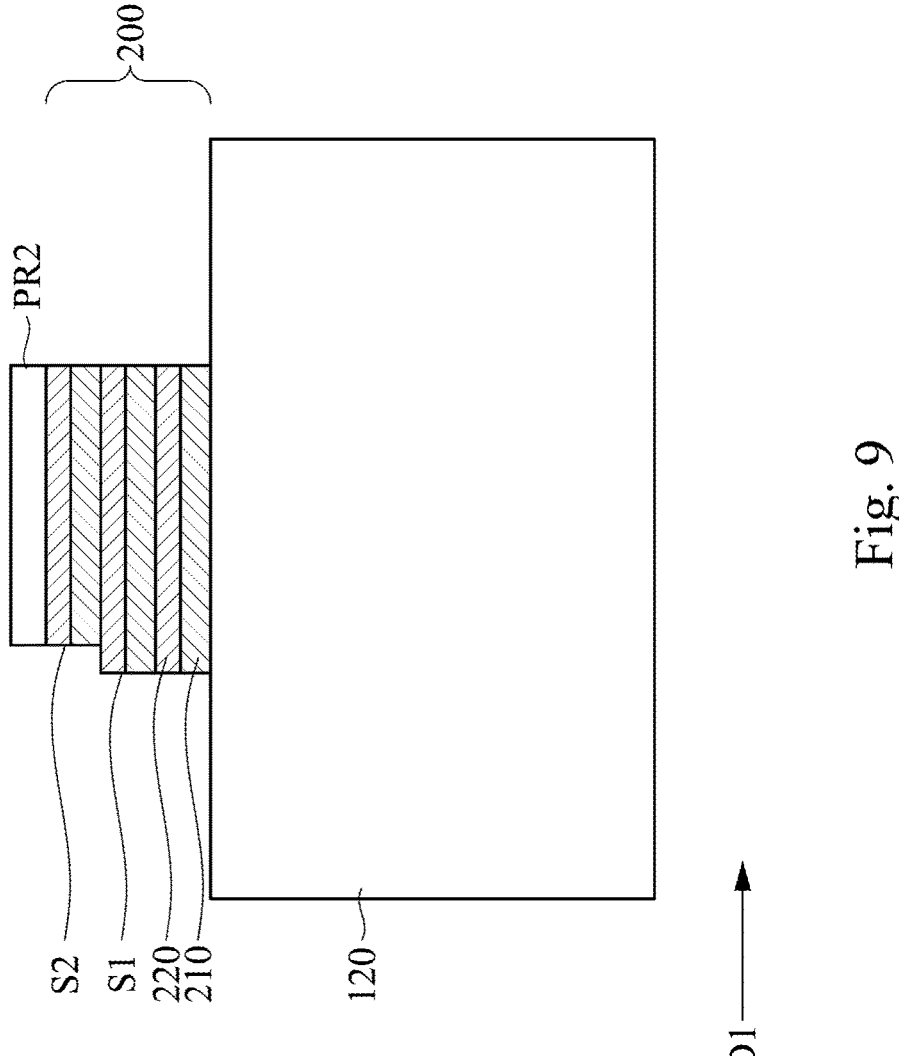
Figure 10:
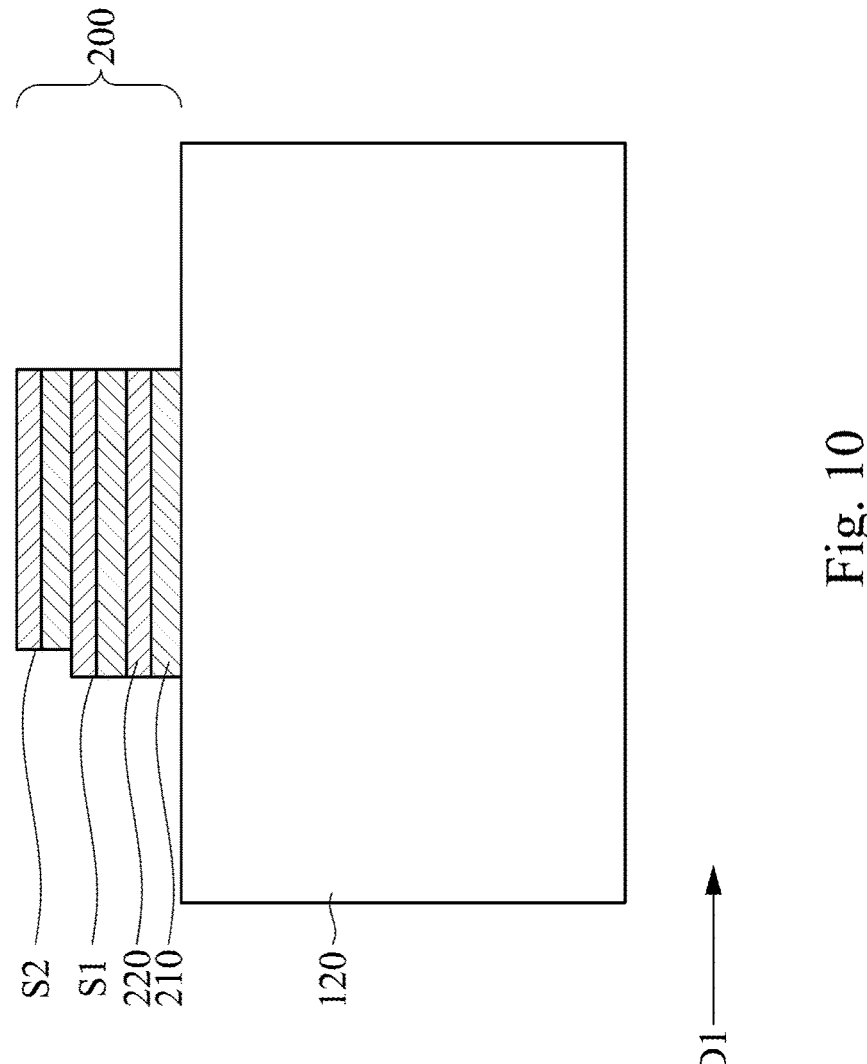

Referring to FIGS. 7-9, the photomask PM is moved along a first direction D1, and a second patterning process is performed to partially pattern the dielectric layer stack 200 by using the photomask PM, so that the dielectric layer stack 200 has the first sidewall S1 and a second sidewall S2 shifted along the first direction D1. The second sidewall S2 is above the first sidewall S1. Specifically, referring to FIG. 7, a photoresist layer PR2 is formed on the dielectric layer stack 200 and the epitaxial layer 120, and the photomask PM is moved along the first direction D1. The photomask PM is the photomask in FIGS. 4-6. In some embodiments, compared to FIG. 4, in FIG. 7, the photomask PM is moved along the first direction D1 by a first distance d1, and the first distance d1 is between (but not limited to) 0.2 micrometers and 0.5 micrometers. Subsequently, referring to FIG. 8, the photoresist layer PR2 is exposed by using the photomask PM, and the photoresist layer PR is developed to remove the exposed portion of the photoresist layer PR2, and the unexposed portion of the photoresist layer PR2 remains. Since the photomask PM is moved along the first direction D1, the remaining photoresist layer PR2 exposes a portion of the dielectric layer stack 200. Subsequently, referring to FIG. 9, the dielectric layer stack 200 is partially patterned by using the photoresist layer PR2. In FIG. 9, firstly, the photoresist layer PR2 is used as the mask, and the first etching gas is used to etch the upmost layer of the second layer 220 in the dielectric layer stack 200. Subsequently, the patterned upmost layer of the second layer 220 may serve as the mask, and then the second etching gas is used to pattern the upmost layer of the first layer 210. The details of the first etching gas and the second etching gas are same as those of the first etching gas and the second etching gas described in FIG. 6. Therefore, the dielectric layer stack 200 has the first sidewall S1 and the second sidewall S2. The second sidewall S2 is above the first sidewall S1 and shifted along the first direction D1. Subsequently, referring to FIG. 10, the photoresist layer PR2 is removed.

Figure 11:
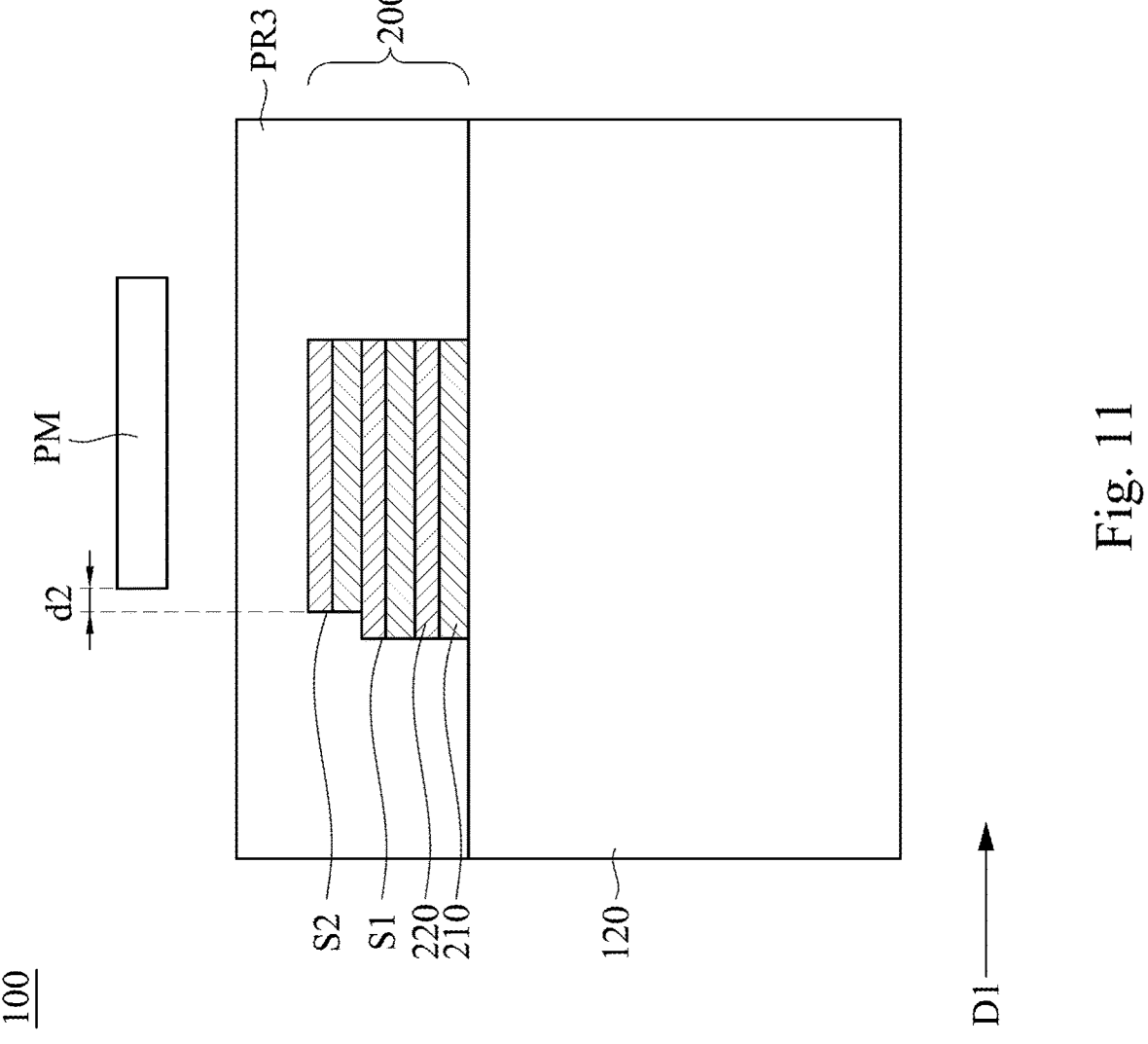
Figure 12:
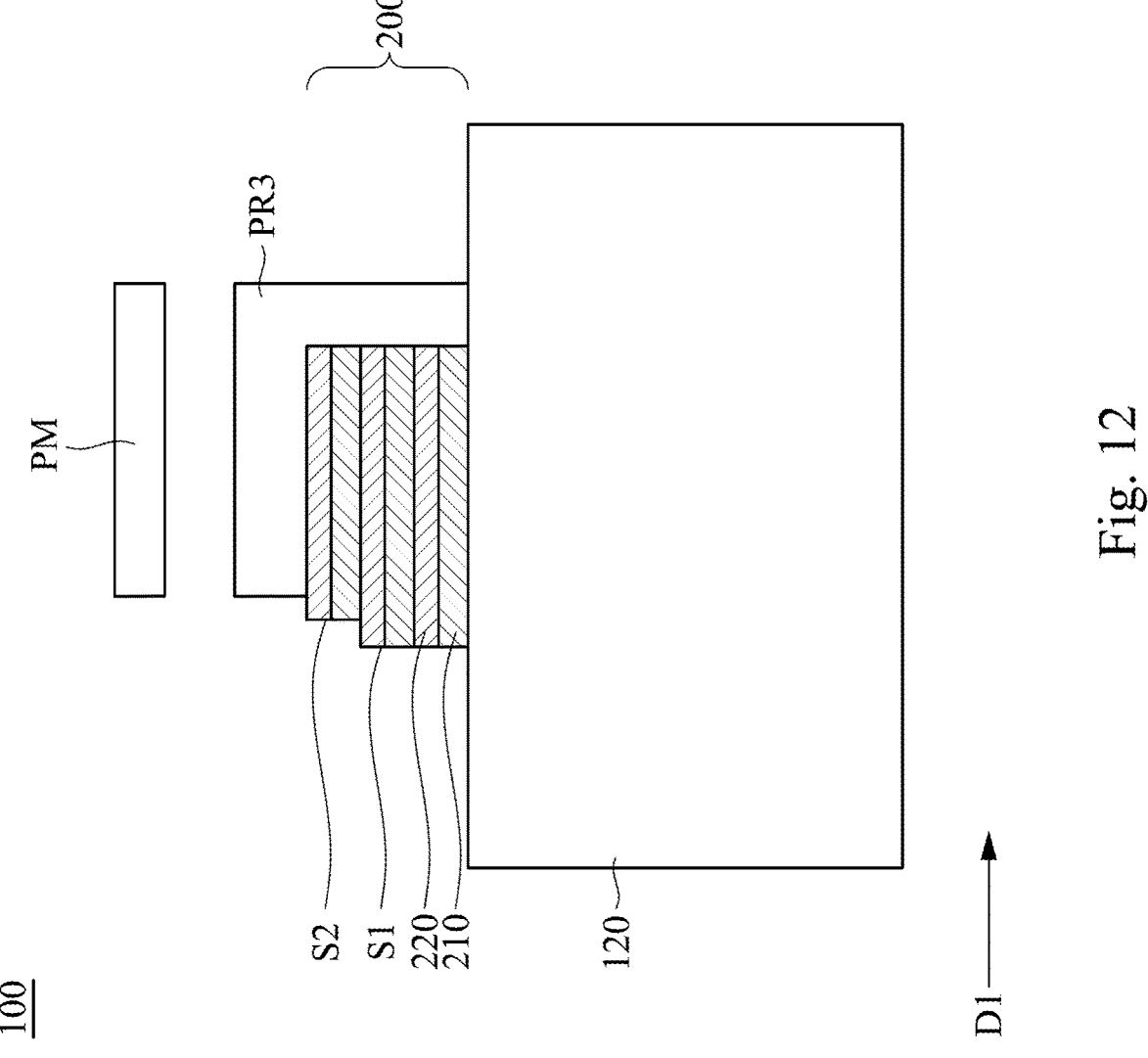
Figure 13:
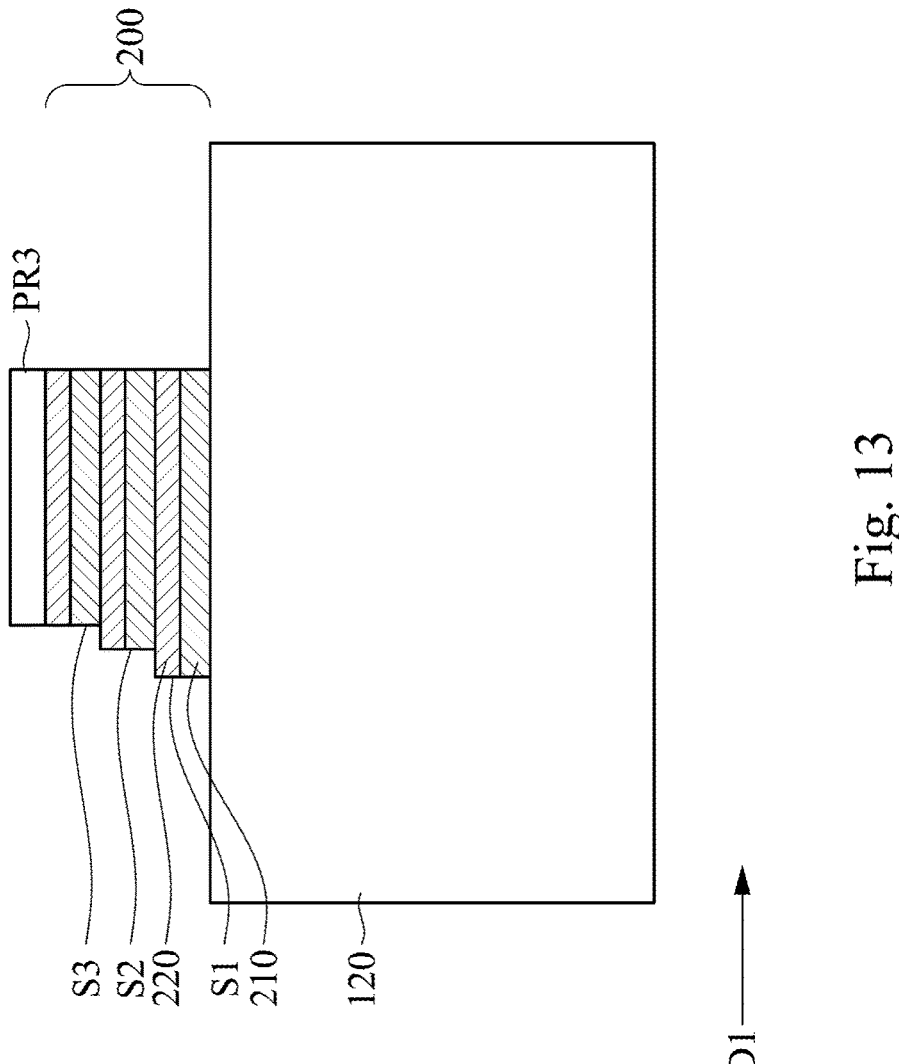
Figure 14:
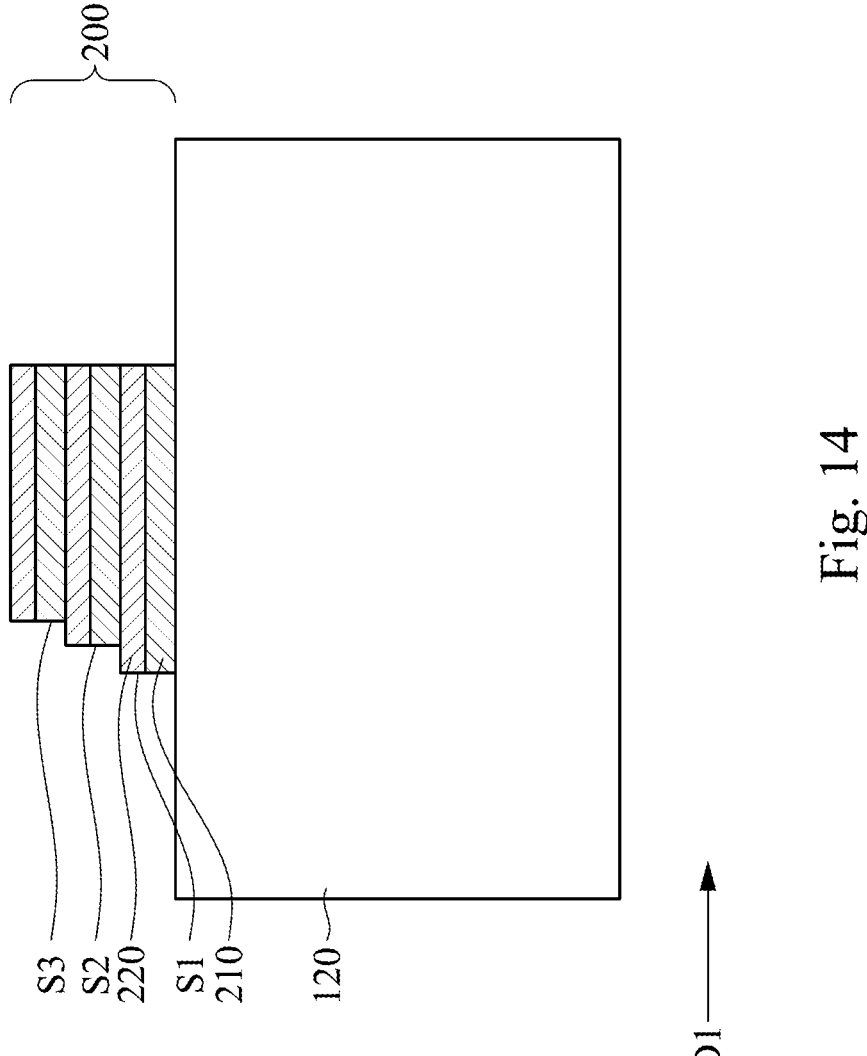

Referring to FIGS. 11-13, the photomask PM is moved along a first direction D1, and a third patterning process is performed to partially pattern the dielectric layer stack 200 by using the photomask PM, so that the dielectric layer stack 200 further has a third sidewall S3. The third sidewall S3 is shifted along first direction D1 compared to the second sidewall S2, and the third sidewall S3 is above the second sidewall S2. Specifically, referring to FIG. 11, a photoresist layer PR3 is formed on the dielectric layer stack 200 and the epitaxial layer 120, and the photomask PM is further moved along the first direction D1. The photomask PM is the photomask in FIGS. 4-6. In some embodiments, compared to FIG. 7, in FIG. 11, the photomask PM is moved along the first direction D1 by a second distance d2, and the second distance d2 is between (but not limited to) 0.2 micrometers and 0.5 micrometers. Subsequently, referring to FIG. 12, the photoresist layer PR3 is exposed by using the photomask PM, and the photoresist layer PR3 is developed to remove the exposed portion of the photoresist layer PR3, and the unexposed portion of the photoresist layer PR3 remains. Since the photomask PM is moved along the first direction D1, the remaining photoresist layer PR3 exposes a portion of the dielectric layer stack 200. Subsequently, referring to FIG. 13, the dielectric layer stack 200 is partially patterned by using the photoresist layer PR3. In FIG. 13, firstly, the photoresist layer PR3 is used as the mask, and the first etching gas is used to etch the upmost layer of the second layer 220 in the dielectric layer stack 200. At the same time, the first etching gas is used to etch the middle layer of the second layer 220 in the dielectric layer stack 200 by using the upmost layer of the second layer 220 in the dielectric layer stack 200 as the mask. Subsequently, the upmost layer of the second layer 220 and the middle layer of the second layer 220 may serve as the mask respectively, and then the second etching gas is used to pattern the upmost layer of the first layer 210 and the middle layer of the first layer 210. The details of the first etching gas and the second etching gas are same as those of the first etching gas and the second etching gas described in FIG. 6. Therefore, the dielectric layer stack 200 has the first sidewall S1, the second sidewall S2 and the third sidewall S3. The second sidewall S2 is above the first sidewall S1 and shifted along the first direction D1. The third sidewall S3 is above the second sidewall S2 and shifted along the first direction D1. Subsequently, referring to FIG. 14, the photoresist layer PR3 is removed.

Figure 15:
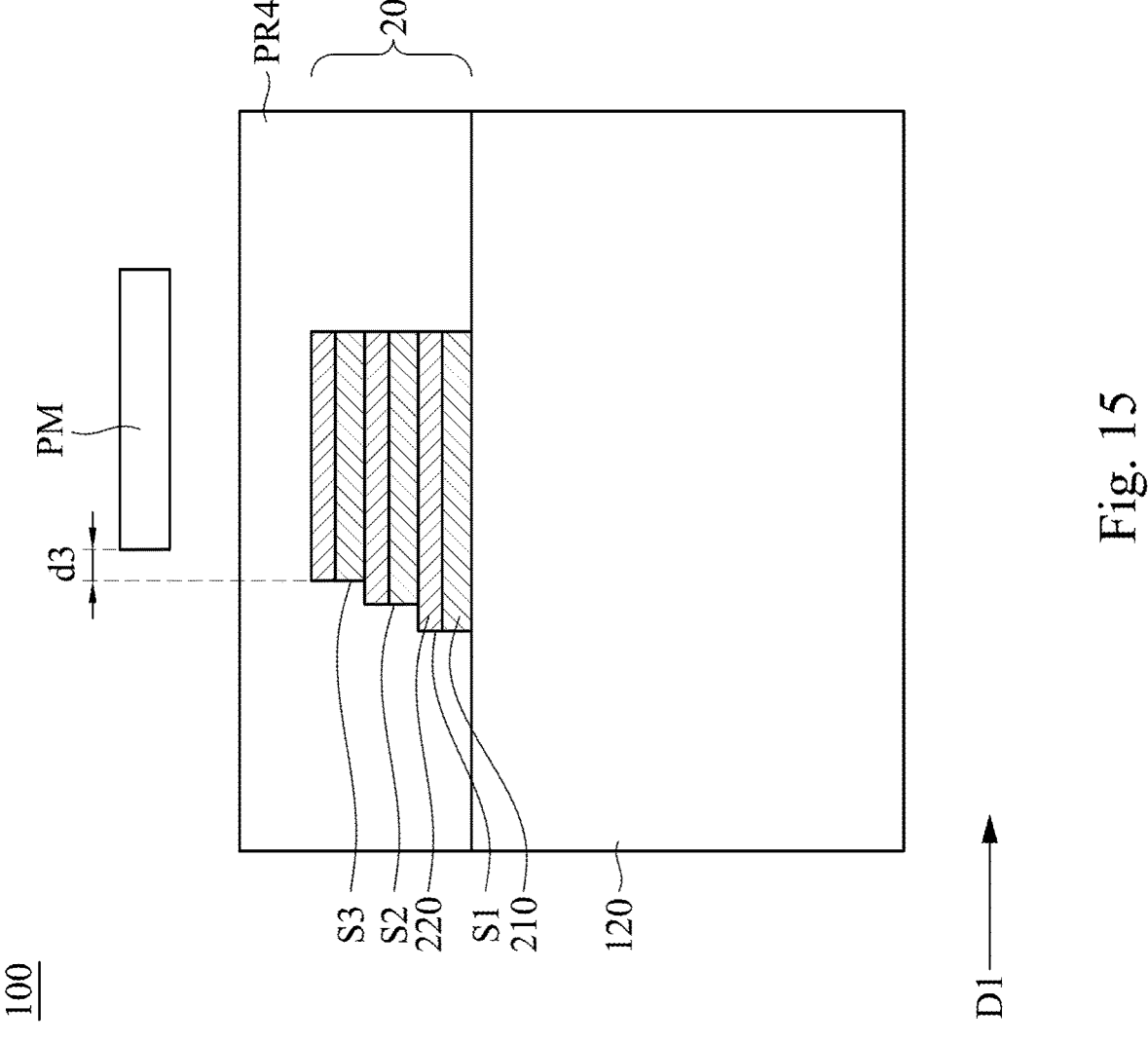
Figure 16:
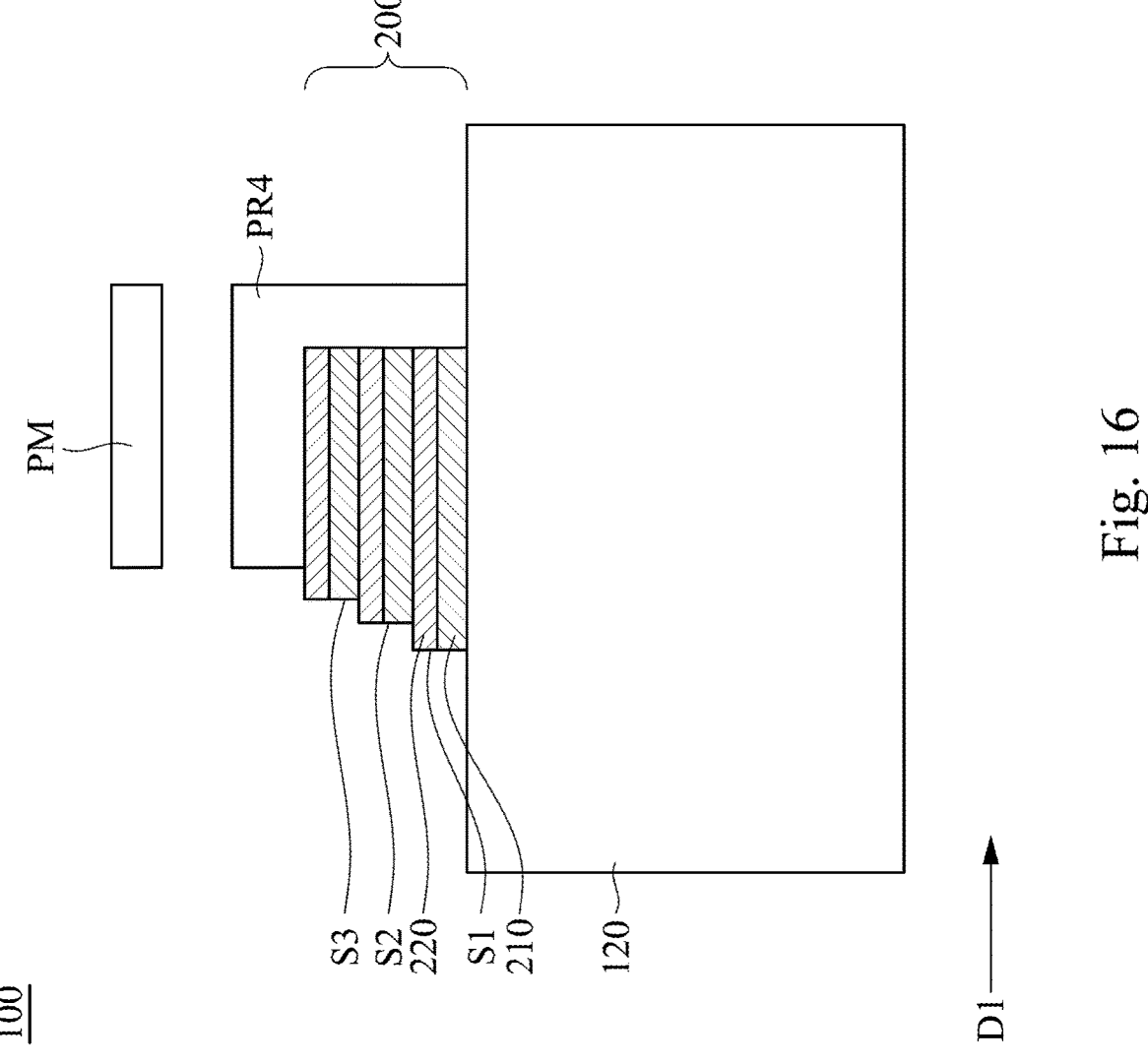
Figure 17:
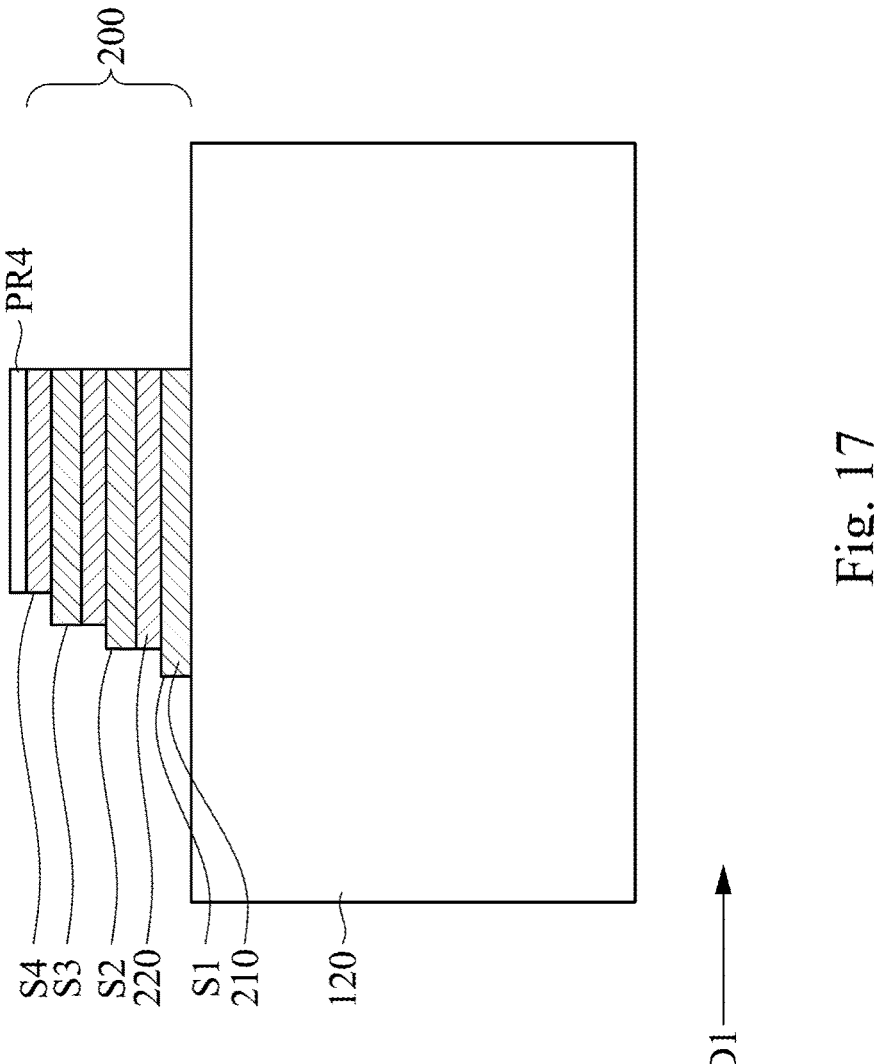
Figure 18:
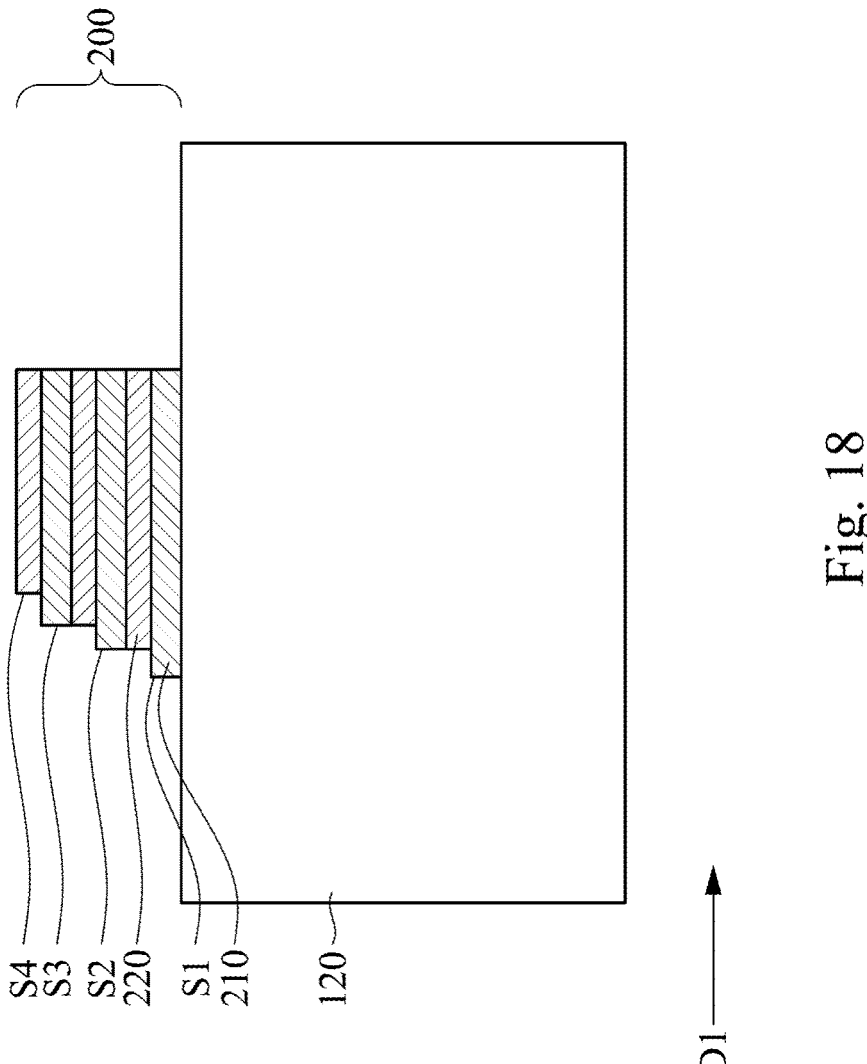

Referring to FIGS. 15-17, the photomask PM is moved along a first direction D1, and a fourth patterning process is performed to partially pattern the dielectric layer stack 200 by using the photomask PM, so that the dielectric layer stack 200 further has a fourth sidewall S4. The fourth sidewall S4 is shifted along first direction D1 compared to the third sidewall S3, and the fourth sidewall S4 is above the third sidewall S3. Specifically, referring to FIG. 15, a photoresist layer PR4 is formed on the dielectric layer stack 200 and the epitaxial layer 120, and the photomask PM is further moved along the first direction D1. The photomask PM is the photomask in FIGS. 4-6. In some embodiments, compared to FIG. 11, in FIG. 15, the photomask PM is moved along the first direction D1 by a third distance d3, and the third distance d3 is between (but not limited to) 0.2 micrometers and 0.5 micrometers. Subsequently, referring to FIG. 16, the photoresist layer PR4 is exposed by using the photomask PM, and the photoresist layer PR4 is developed to remove the exposed portion of the photoresist layer PR4, and the unexposed portion of the photoresist layer PR4 remains. Since the photomask PM is moved along the first direction D1, the remaining photoresist layer PR4 exposes a portion of the dielectric layer stack 200. Subsequently, referring to FIG. 17, the dielectric layer stack 200 is partially patterned by using the photoresist layer PR4. In FIG. 17, the photoresist layer PR4 is used as the mask, and the first etching gas is used to etch the upmost layer of the second layer 220 in the dielectric layer stack 200. At the same time, the first etching gas is used to etch the middle layer of the second layer 220 in the dielectric layer stack 200 and the bottommost layer of the second layer 220 by using the upmost layer of the first layer 210 and the middle layer of the first layer 210 in the dielectric layer stack 200 as the mask. Therefore, the dielectric layer stack 200 has the first sidewall S1, the second sidewall S2, the third sidewall S3 and the fourth sidewall S4. The second sidewall S2 is above the first sidewall S1 and shifted along the first direction D1. The third sidewall S3 is above the second sidewall S2 and shifted along the first direction D1. The fourth sidewall S4 is above the third sidewall S3 and shifted along the first direction D1. Subsequently, referring to FIG. 18, the photoresist layer PR4 is removed.

Figure 19:
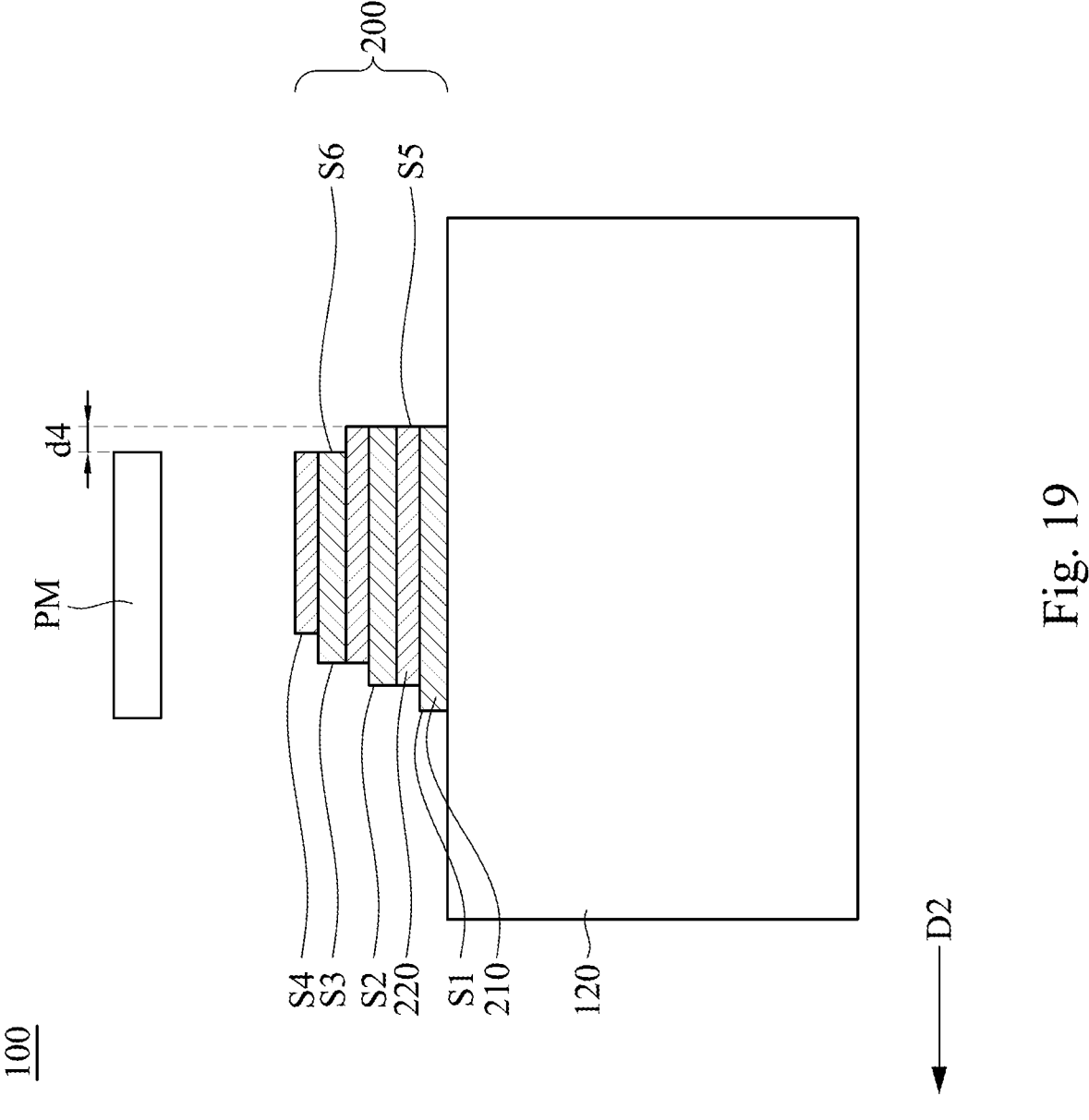

Subsequently, referring to FIGS. 19-22, the other side (such as the right side in FIG. 19) of the dielectric layer stack 200 is formed in a staircase-shaped. Specifically, referring to FIG. 19, the photomask PM is moved along a second direction D2. The second direction D2 is opposite to the first direction D1. A fifth patterning process is performed to partially pattern the dielectric layer stack 200 by using the photomask PM, so that the dielectric layer stack 200 further has a fifth sidewall S5 and a sixth sidewall S6 shifted along the second direction D2. The sixth sidewall S6 is above the fifth sidewall S5, and the fifth sidewall S5 is formed in FIGS. 4-6. The details of the process in FIG. 19 are similar to the details of the process in FIGS. 7-10. The difference is that compared to FIG. 4, the photomask PM is moved along the second direction D2 by a fourth distance d4 in FIG. 19, and the fourth distance d4 is between (but not limited to) 0.2 micrometers and 0.5 micrometers.

Figure 20:
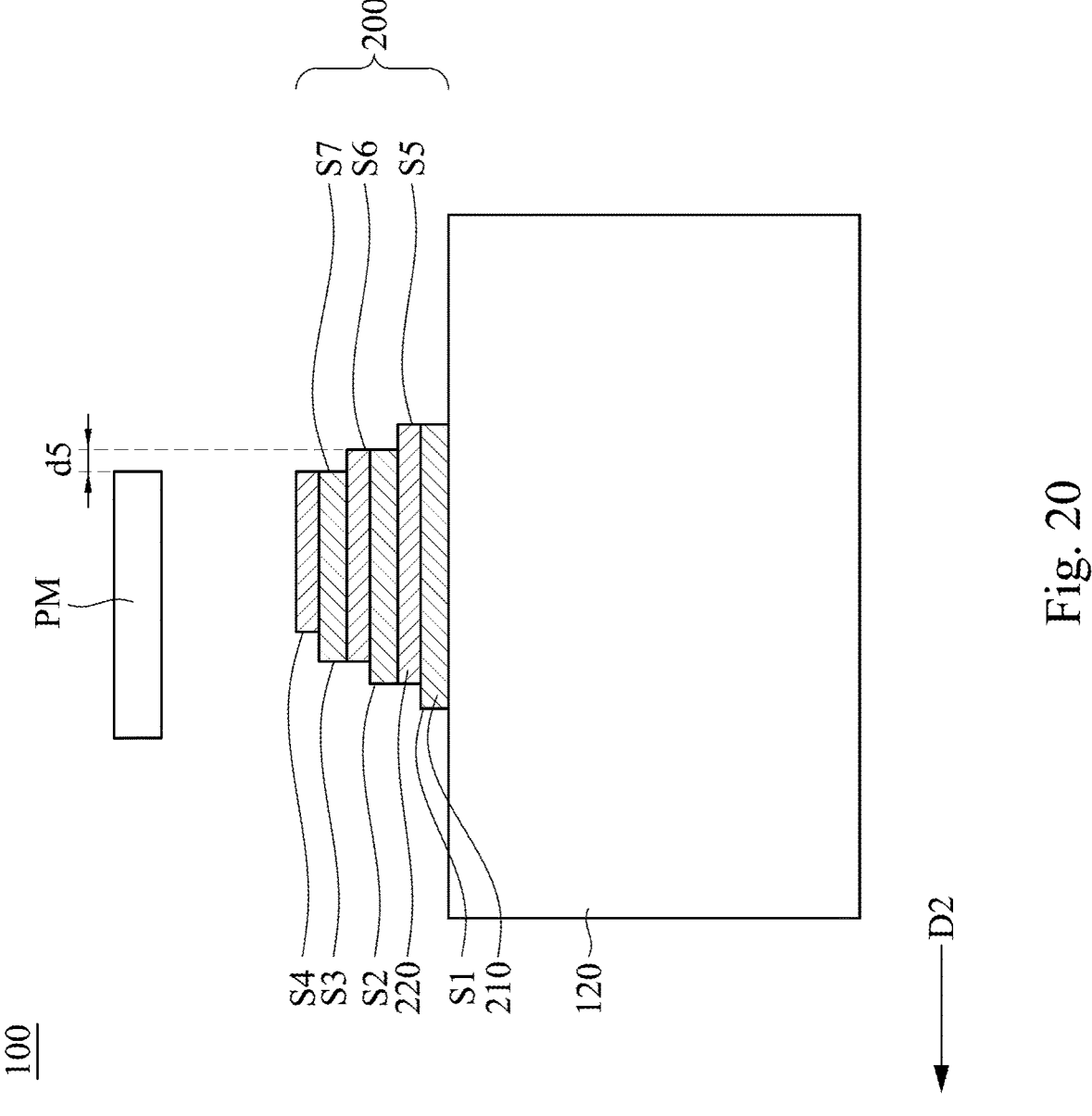

Subsequently, referring to FIG. 20, the photomask PM is moved along the second direction D2. and a sixth patterning process is performed to partially pattern the dielectric layer stack 200 by using the photomask PM, so that the dielectric layer stack 200 further has a seventh sidewall S7. The seventh sidewall S7 is shifted along the second direction D2 compared to the sixth sidewall S6, and the seventh sidewall S7 is above the sixth sidewall S6. The details of the process in FIG. 20 are similar to the details of the process in FIGS. 11-14. The difference is that compared to FIG. 19, the photomask PM is moved along the second direction D2 by a fifth distance d5 in FIG. 20, and the fifth distance d5 is between (but not limited to) 0.2 micrometers and 0.5 micrometers.

Figure 21:
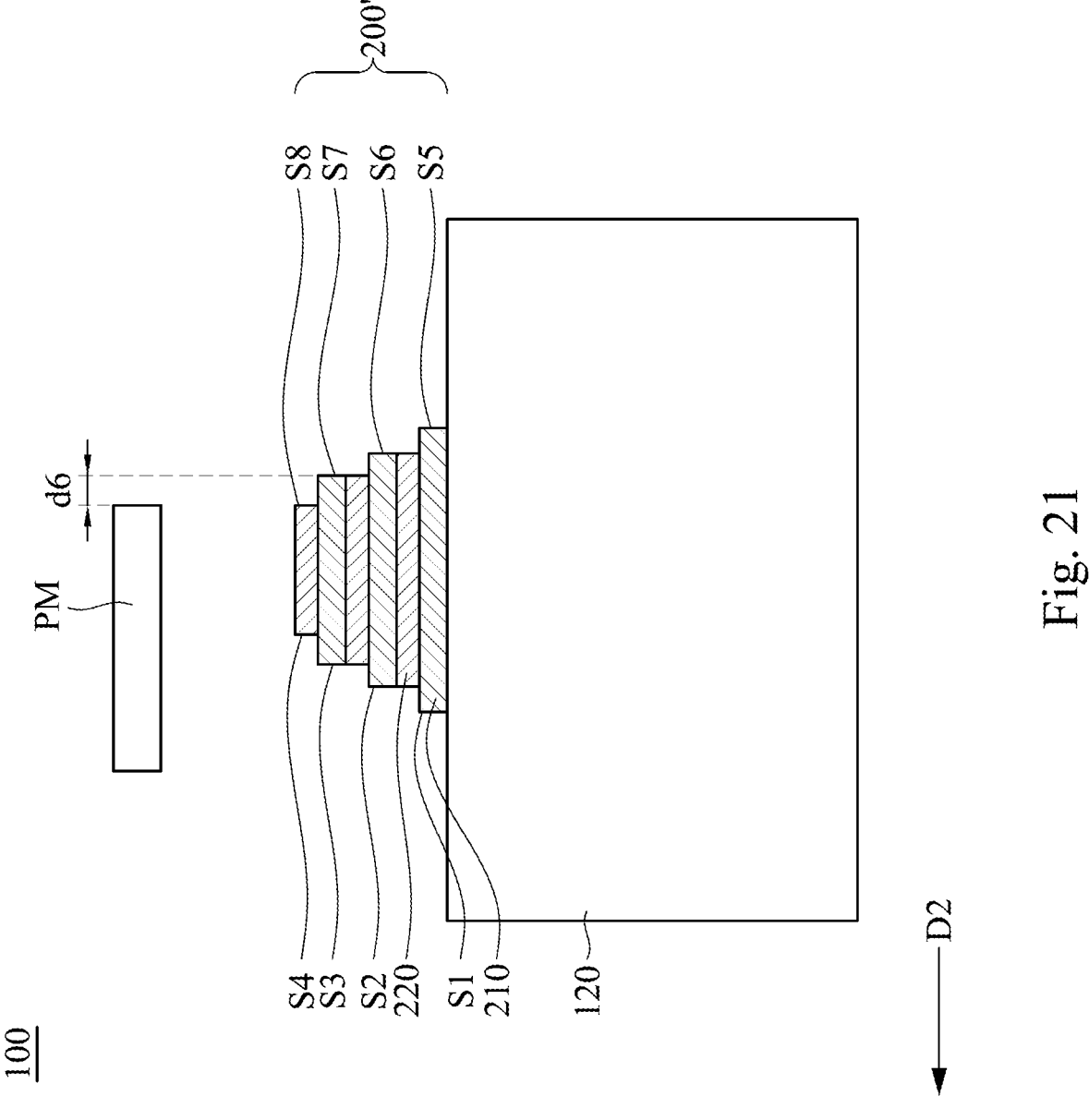
Figure 22:
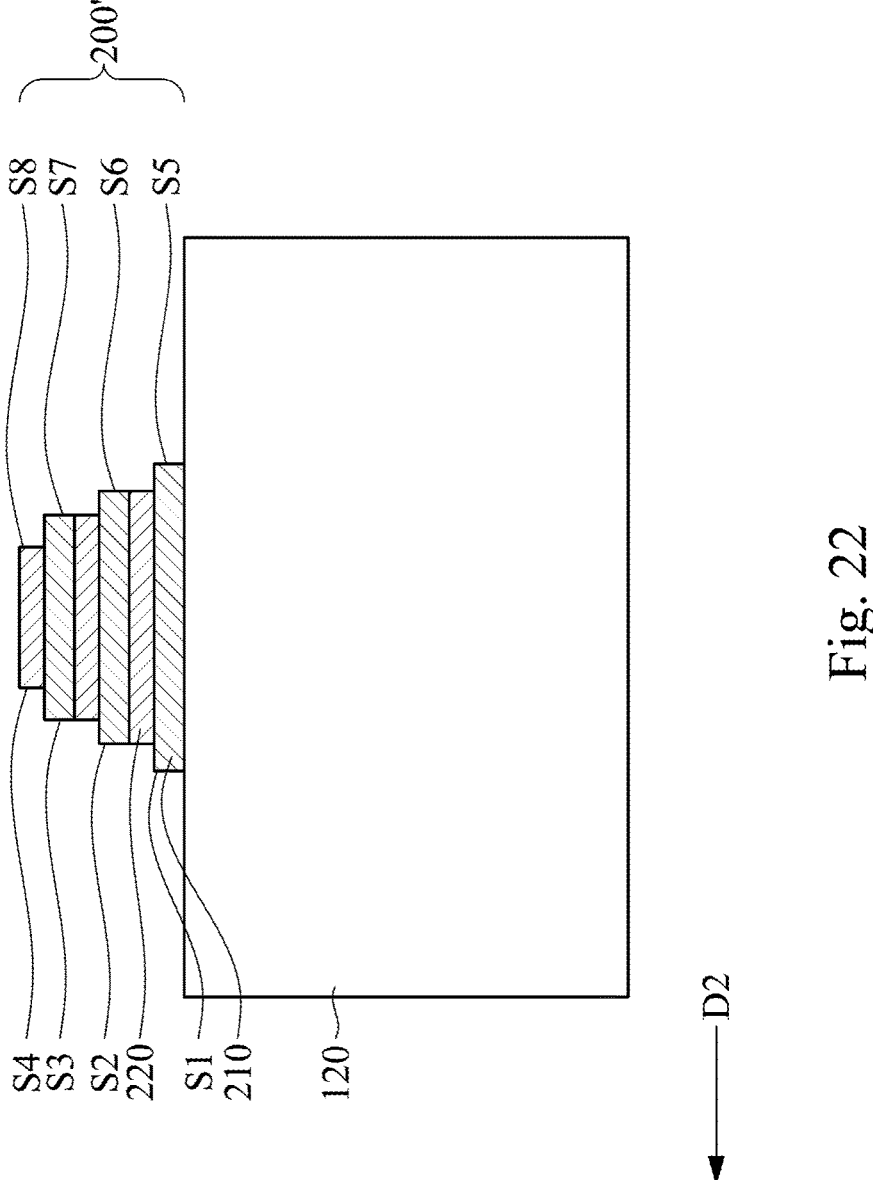

Subsequently, referring to FIG. 21, the photomask PM is moved along the second direction D2, and a seventh patterning process is performed to partially pattern the dielectric layer stack 200 by using the photomask PM, so that the dielectric layer stack 200 further has an eighth sidewall S8. The eighth sidewall S8 is shifted along the second direction D2 compared to the seventh sidewall S7, and the eighth sidewall S8 is above the seventh sidewall S7. The details of the process in FIG. 21 are similar to the details of the process in FIGS. 15-18. The difference is that compared to FIG. 20, the photomask PM is moved along the second direction D2 by a sixth distance d6 in FIG. 21, and the sixth distance d6 is between (but not limited to) 0.2 micrometers and 0.5 micrometers. Therefore, referring to FIG. 22, a staircase-shaped dielectric layer stack 200' is formed on the epitaxial layer 120, and the staircase-shaped dielectric layer stack 200' has the first sidewall S1, the second sidewall S2, the third sidewall S3 and the fourth sidewall S4 shifted toward the first direction D1 in sequence, and the fifth sidewall S5, the sixth sidewall S6, the seventh sidewall S7 and the eighth sidewall S8 shifted toward the second direction D2 in sequence.

Figure 23:
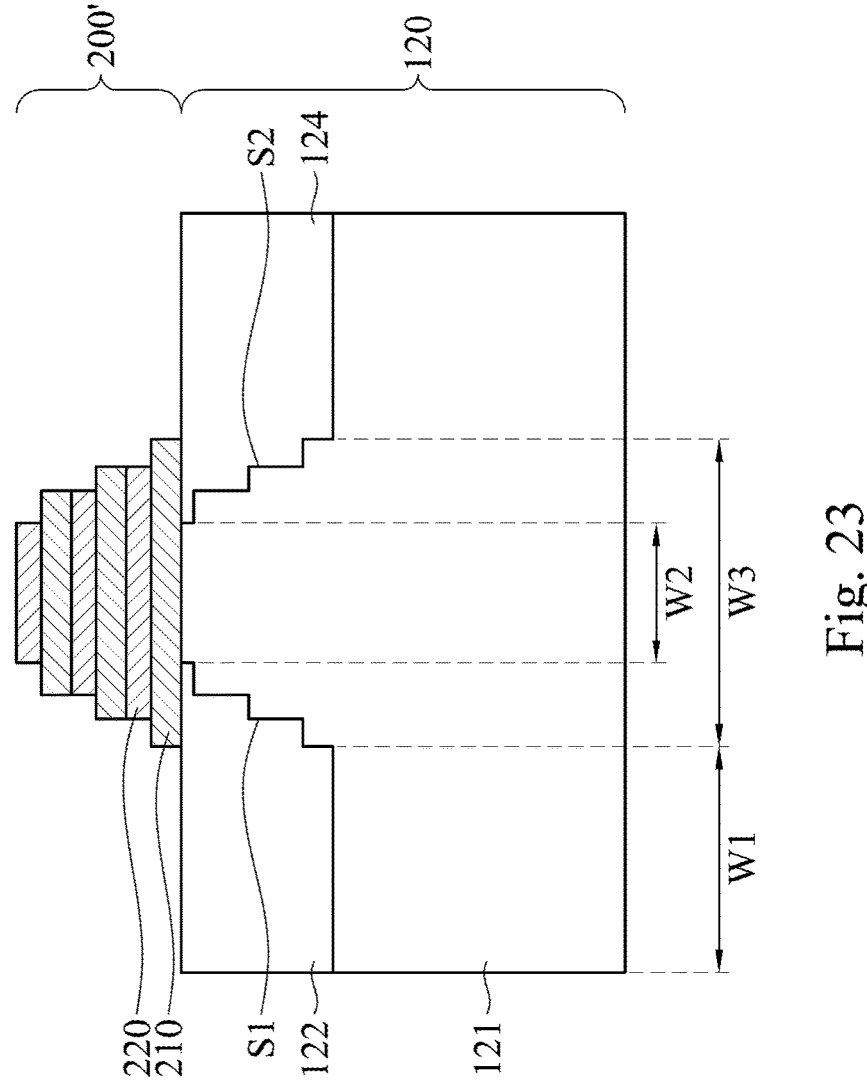

Subsequently, referring to FIG. 23, an ion implantation process is performed to the epitaxial layer 120 by using the staircase-shaped dielectric layer stack 200'. After performing the ion implantation process, the first well region 122 and the second well region 124 are formed in the epitaxial layer 120, and the staircase-shaped dielectric layer stack 200' partially covers the first well region 122 and the second well region 124. Specifically, the thickness of the staircase-shaped dielectric layer stack 200' is not uniform, and the thickness of the staircase-shaped dielectric layer stack 200' becomes smaller as it gets closer to the outer side of the staircase-shaped dielectric layer stack 200'. Therefore, during implanting ions, the implanted ions may enter the epitaxial layer 120 through the thinner portion of the stair-case-shaped dielectric layer stack 200'. As such, ions are not only implanted into the region which is not covered by the staircase-shaped dielectric layer stack 200', but also implanted into the region covered by the thinner portion of the staircase-shaped dielectric layer stack 200'.

The ions implanted into the epitaxial layer 120 by the ion implantation process are dopants of the second semiconductor type. Therefore, when forming the first well region 122 and the second well region 124, the remaining portion of the epitaxial layer 120 forms the drift region 121. The drift region 121 is under the first well region 122, and the drift region 121 includes dopants of the first semiconductor type. The first well region 122 (or second well region 124) includes dopants of the second semiconductor type, and the first semiconductor type and the second semiconductor type are different semiconductor type.

The boundary 122S of the first well region 122 and the boundary 124S of the second well region 124 substantially correspond with the sidewall of the staircase-shaped dielectric layer stack 200'. That is, the first well region 122 has a width W1. The width W1 becomes greater as getting closer to the staircase-shaped dielectric layer stack 200'. The distance between the boundary 124S of the second well region 124 and the boundary 122S of the first well region 122 becomes smaller as getting closer to the staircase-shaped dielectric layer stack 200'. In some embodiments, at the location near the bottom of the first well region 122 and the second well region 124, the distance W3 between the first well region 122 and the second well region 124 is between 0.5 micrometers to 5 micrometers. At the location near the top of the first well region 122 and the second well region 124, the distance W2 between the first well region 122 and the second well region 124 is between 0.5 micrometers to 3 micrometers. The boundary 122S of the first well region 122 and the boundary 124S of the second well region 124 may be slanting or staircase-shaped. In some embodiments, if the staircase-shaped dielectric layer stack 200' includes more layers, the boundary 122S of the first well region 122 and the boundary 124S are more approximate to the slanting line, as shown in FIG. 1. If the first well region 122 and the second well region 124 have the profiles as mentioned above, the possibility of contact between depletion regions is reduced, thereby reducing the resistance of the semiconductor device.

Figure 24:
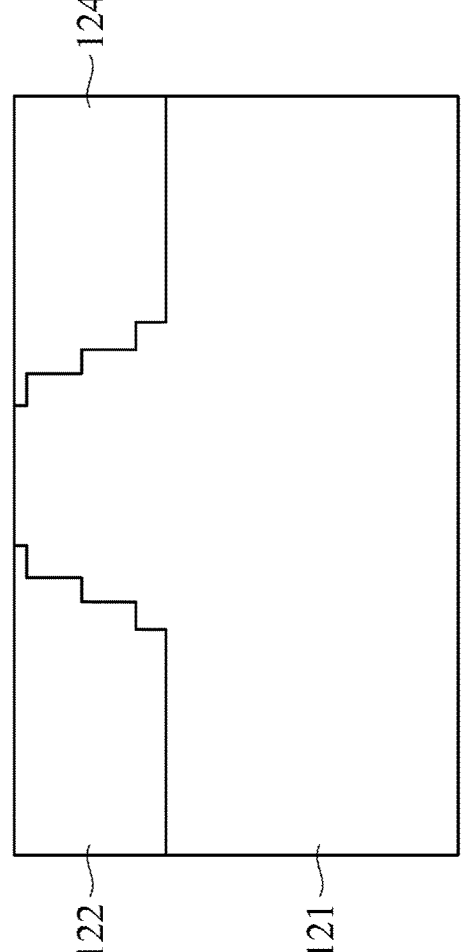

Subsequently, referring to FIG. 24, the staircase-shaped dielectric layer stack 200' is removed. Subsequently, the source region 126, the base region 128, the gate dielectric layer 130, the gate layer 140, the source contact 150 and the drain electrode 160 are formed in subsequent processes to form the semiconductor device 100 as shown in FIG. 1.

As mentioned above, the profiles of the well regions in some embodiments of the present disclosure are beneficial to reduce the possibility of contact between the depletion regions when the semiconductor device is turned on, thereby reducing the resistance of the semiconductor device. Specifically, the boundaries of the well regions may be slanting or staircase-shaped, so it is difficult for the depletion regions near the boundaries of the well regions to be in contact with each other, or only the upmost portion of the depletion regions are in contact with each other when the semiconductor device is turned on. Moreover, the staircase-shaped dielectric layer stack including first layers and second layers are used as the mask in some embodiments of the present disclosure, and the well regions with slanting or staircase-shaped boundaries are formed. When forming the staircase-shaped dielectric layer stack, the shape of the staircase-shaped dielectric layer stack may be adjusted by adjusting the thickness of the first layers and the second layers, the shifting distance of the photomask, the number of the layers in the staircase-shaped dielectric layer stack, thereby further adjusting the profile of the boundaries of the well regions to reduce the resistance of the semiconductor device.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a semiconductor device, comprising:
   forming a dielectric layer stack on an epitaxial layer, wherein the dielectric layer stack includes at least one first layer and at least one second layer, the at least one first layer is made of a first material, the at least one second layer is made of a second material different from the first material;
   patterning the dielectric layer stack to form a staircase-shaped dielectric layer stack, wherein patterning the dielectric layer stack comprises:
      performing a first patterning process to pattern the dielectric layer stack by using a photomask, wherein the dielectric layer stack has a first sidewall; and
      moving the photomask along a first direction and performing a second patterning process to partially pattern the dielectric layer stack, so that the dielectric layer stack has the first sidewall and a second sidewall shifted along the first direction, the second sidewall is above the first sidewall; and
   performing an ion implantation process to the epitaxial layer by using the staircase-shaped dielectric layer stack.

2. The method of claim 1, wherein patterning the dielectric layer stack further comprises:
   moving the photomask along the first direction and performing a third patterning process to partially pattern the dielectric layer stack, so that the dielectric layer stack has a third sidewall, wherein the third sidewall is shifted along the first direction compared to the second sidewall, and the third sidewall is above the second sidewall.

3. The method of claim 1, wherein patterning the dielectric layer stack further comprises:
   moving the photomask along a second direction opposite to the first direction, and performing a fourth patterning process to partially pattern the dielectric layer stack, so that the dielectric layer stack further has a fourth sidewall and a fifth sidewall shifted along the second direction, the fifth sidewall is above the fourth sidewall.

4. The method of claim 1, wherein patterning the dielectric layer stack comprises:
   using a first etching gas to etch the at least one second layer of the dielectric layer stack; and
   using a second etching gas to etch the at least one first layer of the dielectric layer stack, wherein the first etching gas is different from the second etching gas.

5. The method of claim 1, wherein a well region is formed when performing the ion implantation process to the epitaxial layer, and the staircase-shaped dielectric layer stack partially covers the well region.

6. The method of claim 5, wherein the well region has a width, and the width becomes greater as being closer to the staircase-shaped dielectric layer stack.

7. A method of manufacturing a semiconductor device, comprising:
   forming a dielectric layer stack on an epitaxial layer, wherein the dielectric layer stack includes first layers and second layers, the first layers are made of a first material, the second layers are made of a second material different from the first material;
   patterning the dielectric layer stack to form a staircase-shaped dielectric layer stack, wherein patterning the dielectric layer stack comprises:
      performing a first patterning process to pattern the dielectric layer stack by using a photomask, wherein the dielectric layer stack has a first sidewall; and
      moving the photomask along a first direction and performing a second patterning process to partially pattern the dielectric layer stack, so that the dielectric layer stack has the first sidewall and a second sidewall shifted along the first direction, the second sidewall is above the first sidewall; and
   performing an ion implantation process to the epitaxial layer by using the staircase-shaped dielectric layer stack to form a first well region in the epitaxial layer, wherein a boundary of the first well region is staircase-shaped.

8. The method of claim 7, wherein patterning the dielectric layer stack further comprises:
   moving the photomask along the first direction and performing a third patterning process to partially pattern the dielectric layer stack, so that the dielectric layer stack has a third sidewall, wherein the third sidewall is shifted along the first direction compared to the second sidewall, and the third sidewall is above the second sidewall.

9. The method of claim 8, wherein patterning the dielectric layer stack further comprises:
   moving the photomask along the first direction and performing a fourth patterning process to partially pattern the dielectric layer stack, so that the dielectric layer stack has a fourth sidewall, wherein the third sidewall is shifted along the first direction compared to the third sidewall, and the fourth sidewall is above the third sidewall.

10. The method of claim 7, wherein patterning the dielectric layer stack further comprises:
   moving the photomask along a second direction opposite to the first direction, and performing a fifth patterning process to partially pattern the dielectric layer stack, so that the dielectric layer stack further has a fifth sidewall and a sixth sidewall shifted along the second direction, the sixth sidewall is above the fifth sidewall.

11. The method of claim 10, wherein patterning the dielectric layer stack further comprises:
   moving the photomask along the second direction, and performing a sixth patterning process to partially pattern the dielectric layer stack, so that the dielectric layer stack further has a seventh sidewall shifted along the second direction compared to the sixth sidewall, the seventh sidewall is above the sixth sidewall.

12. The method of claim 11, wherein patterning the dielectric layer stack further comprises:
   moving the photomask along the second direction, and performing a seventh patterning process to partially pattern the dielectric layer stack, so that the dielectric layer stack further has an eighth sidewall shifted along the second direction compared to the seventh sidewall, the eighth sidewall is above the seventh sidewall.

13. The method of claim 7, wherein the staircase-shaped dielectric layer stack partially covers the first well region after performing the ion implantation process.

14. The method of claim 7, further comprising removing the staircase-shaped dielectric layer stack after performing the ion implantation process.

* * * * *